United States Patent [19]

Merrill

[11] Patent Number: 5,789,774
[45] Date of Patent: Aug. 4, 1998

[54] ACTIVE PIXEL SENSOR CELL THAT MINIMIZES LEAKAGE CURRENT

[75] Inventor: Richard Billings Merrill, Daly City, Calif.

[73] Assignee: Foveonics, Inc., Cupertino, Calif.

[21] Appl. No.: 855,961

[22] Filed: May 14, 1997

Related U.S. Application Data

[63] Continuation of Ser. No. 664,191, Jun. 10, 1996, abandoned, which is a continuation-in-part of Ser. No. 609,566, Mar. 1, 1996.

[51] Int. Cl.$^6$ .................... H01L 29/04; H01L 27/148; H01L 31/062; H01L 31/00
[52] U.S. Cl. .................... 257/292; 257/59; 257/222; 257/232; 257/233; 257/290; 257/291; 257/292; 257/446
[58] Field of Search .................... 257/59, 222, 290, 257/291, 292, 446, 232, 233

[56] References Cited

U.S. PATENT DOCUMENTS

| | | | |
|---|---|---|---|
| 5,070,032 | 12/1991 | Yuan et al. | 437/43 |
| 5,191,398 | 3/1993 | Mutoh | 257/216 |
| 5,289,023 | 2/1994 | Mead | 257/291 |
| 5,432,551 | 7/1995 | Matsunaga | 257/233 |
| 5,481,124 | 1/1996 | Kozuka et al. | 257/232 |
| 5,488,239 | 1/1996 | Jung | 257/232 |
| 5,506,429 | 4/1996 | Tanaka et al. | 257/233 |
| 5,552,619 | 9/1996 | Bergemont et al. | 257/291 |
| 5,566,044 | 10/1996 | Bergemont et al. | 361/321.1 |
| 5,576,562 | 11/1996 | Konuma | 257/232 |

FOREIGN PATENT DOCUMENTS

| | | | |
|---|---|---|---|
| 000157376 | 10/1985 | European Pat. Off. | 257/232 |
| 362216262 | 9/1987 | Japan | 257/232 |

OTHER PUBLICATIONS

S.N. 08/509,421 [NSC1-67800], Merrill.
S.N. 08/511,609, [NSC1-67900], Merrill.
S.N. 08/438,347 [NSC1-62200], Bergemont et al.
08/609,566 [NSC1-A0400], Merrill, Richard B.
Fossum, E., "Active-pixel sensors challenge CCDs," Technology Guide: Detector Handbook, Laser Focus World, Jun. 1993, pp. 83–87, Pasadena, CA.
Mendis, S. et al., "Progress in CMOS Active Pixel Image Sensors," SPIE vol. 2172, (1994) Center for Space Microelectronics Tech., Jet Propulsion Laboratory, California Institute of Technology, pp. 19–29, paper presented at a Conference on Feb. 7–8, 1994 in San Jose, CA.
Kawashima, H. et al., "A ¼ Inch Format 250K Pixel Amplified MOS Image Sensor Using CMOS Process," IEEE, pp. 575–578, Tokyo, Japan.
Dickinson, A. et al., "TP 13.5: A 256×256 CMOS Active Pixel Image Sensor with Motion Detection," pp. 226–227, 1995 IEEE International Solid–State Circuits Conf., Pasadena, CA., (1995).

Primary Examiner—Mahshid D. Saadat
Assistant Examiner—Ida Marie Soward
Attorney, Agent, or Firm—Limbach & Limbach L.L.P.

[57] ABSTRACT

The leakage current at the silicon-to-silicon dioxide interfaces of an active pixel sensor cell is substantially reduced by eliminating field oxide from the cell, and by insuring that, during integration, every surface region of the cell that is not heavily doped is either biased into accumulation or biased into inversion. Each of these states, in turn, substantially limits the number of electrons from thermally-generated electron-hole pairs at the surface that can contribute to the leakage current.

30 Claims, 22 Drawing Sheets

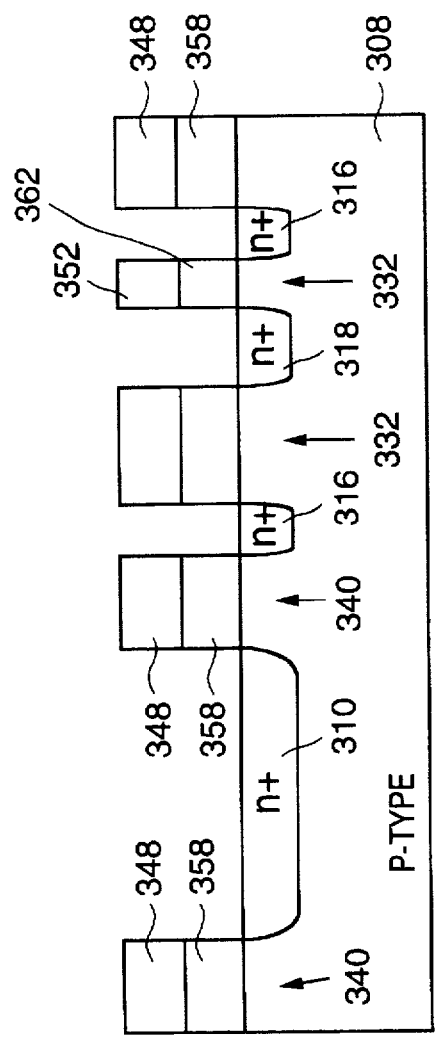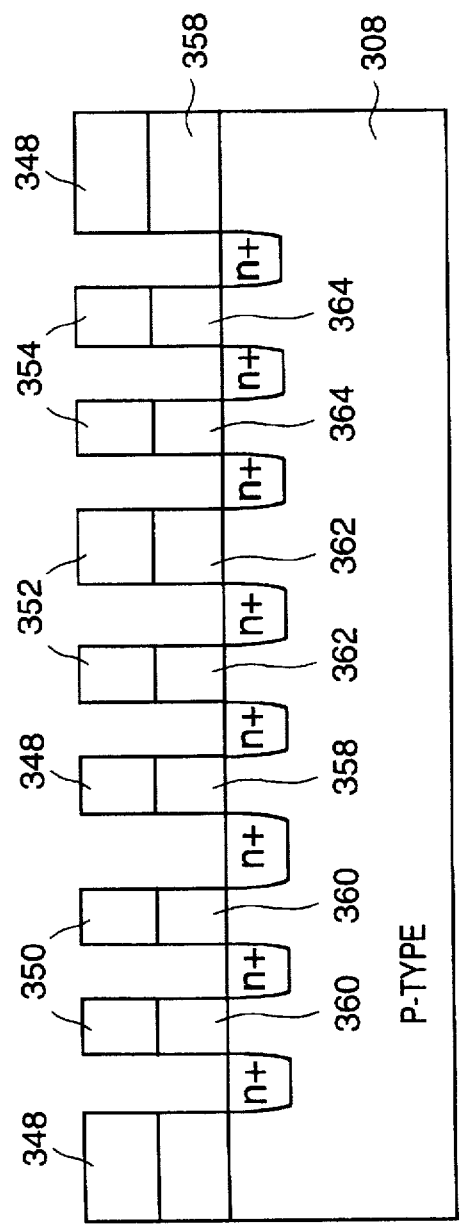

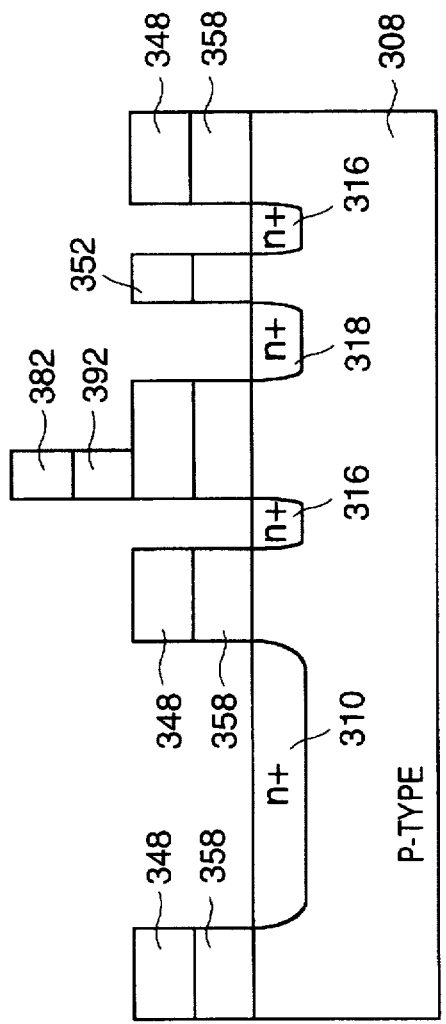
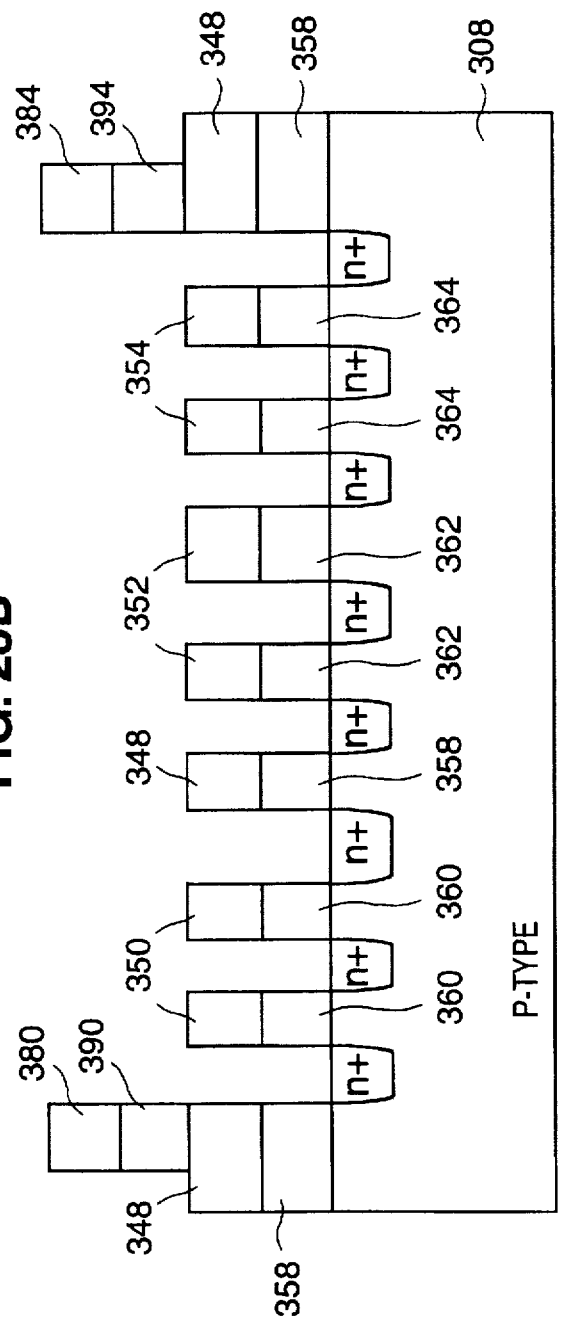
FIG. 23B
FIG. 23C

5,789,774

ACTIVE PIXEL SENSOR CELL THAT MINIMIZES LEAKAGE CURRENT

RELATED APPLICATIONS

This is a continuation of application Ser. No. 08/664,191 filed on Jun. 10, 1996, now abandoned which application is a continuation-in-part of Ser. No. 08/609,566 filed Mar. 1, 1996 for Low Stress Photodiode with Reduced Junction Leakage.

BACKGROUND OF THE INVENTION

1. Field of the Invention

The present invention relates to active pixel sensor cells and, more particularly, to an active pixel sensor cell that minimizes leakage current.

2. Description of the Related Art

Charge-coupled devices (CCDs) have been the mainstay of conventional imaging circuits for converting a pixel of light energy into an electrical signal that represents the intensity of the light energy. In general, CCDs utilize a photogate to convert the light energy into an electrical charge, and a series of electrodes to transfer the charge collected at the photogate to an output sense node.

Although CCDs have many strengths, which include a high sensitivity and fill-factor, CCDs also suffer from a number of weaknesses. Most notable among these weaknesses, which include limited readout rates and dynamic range limitations, is the difficulty in integrating CCDs with CMOS-based microprocessors.

To overcome the limitations of CCD-based imaging circuits, more recent imaging circuits use active pixel sensor cells to convert a pixel of light energy into an electrical signal. With active pixel sensor cells, a conventional photodiode is typically combined with a number of active transistors which, in addition to forming an electrical signal, provide amplification, readout control, and reset control.

FIG. 1 shows an example of a conventional CMOS active pixel sensor cell 10. As shown in FIG. 1, cell 10 includes a photodiode 12, a reset transistor 14, whose source is connected to photodiode 12, a sense transistor 16; whose gate is connected to photodiode 12, and a select transistor 18, whose drain is connected in series to the source of sense transistor 16.

Operation of active pixel sensor cell 10 is performed in three steps: a reset step, where cell 10 is reset from the previous integration cycle; an image integration step, where the light energy is collected and converted into an electrical signal; and a signal readout step, where the signal is read out.

As shown in FIG. 1, during the reset step, the gate of reset transistor 14 is briefly pulsed with a reset voltage (5 volts) which resets photodiode 12 to an initial integration voltage which is equal to $V_R-V_{T14}$, where $V_R$ represents the reset voltage, and $V_{T14}$ represents the threshold voltage of reset transistor 14.

During integration, light energy, in the form of photons, strikes photodiode 12, thereby creating a number of electron-hole pairs. Photodiode 12 is designed to limit recombination between the newly formed electron-hole pairs. As a result, the photogenerated holes are attracted to the ground terminal of photodiode 12, while the photogenerated electrons are attracted to the positive terminal of photodiode 12 where each additional electron reduces the voltage on photodiode 12.

At the end of the integration period, the final voltage on photodiode 12 is equal to $V_R-V_{T14}-V_S$, where $V_S$ represents the change in voltage due to the absorbed photons. Thus, the number of photons which were absorbed by photodiode 12 during the image integration period can be determined by subtracting the voltage at the end of the integration period from the voltage at the beginning of the integration period, thereby yielding the value $V_S$, i.e., $((V_R-V_{T14})-(V_R-V_{T14}-V_S))$.

Following the image integration period, active pixel sensor cell 10 is read out by turning on select transistor 18 (which has been turned off until this point). When select transistor 18 is turned on, the reduced voltage on photodiode 12 reduces the voltage on the gate of sense transistor 16 which, in turn, reduces the magnitude of the current flowing through transistors 16 and 18. The reduced current level is then detected by conventional current detectors.

One problem with active pixel sensor cell 10, however, is a limited dynamic range. The fundamental limit on the dynamic range of cell 10 is defined by the thermal (kT/C) noise of cell 10 to be approximately 13 bits. In actual practice, however, the dynamic range of cell 10 is limited by a leakage current at the silicon-to-silicon dioxide interfaces ($Si/SiO_2$) to approximately 10 bits at room temperature. (1/f noise is actually worse than leakage noise at room temperature, but can usually be eliminated by correlated double sampling techniques).

The silicon-to-silicon dioxide interfaces include, for example, the substrate-to-field oxide interface, the substrate-to-gate oxide interface, and the substrate-to-protective oxide interface (oxide grown over the surface of an exposed substrate region to protect the substrate). Although each of these interfaces add to the total leakage current, the problem is most pronounced at the bird's beak region of the substrate-to-field oxide interface where the leakage is approximately 100× worse than at the other interfaces.

The leakage current at the silicon-to-silicon dioxide interfaces is widely believed to be caused by lattice defects that occur during the formation of the oxides. These lattice defects create mid-band energy states that allow electrons from thermally-generated electron-hole pairs to more readily transition from the valence band to the conduction band. Once in the conduction band, these electrons contribute to the total photogenerated electrons, thereby adding an error term.

Thus, to increase the dynamic range of an active pixel sensor cell towards the fundamental limit of the cell, there is a need for an active pixel sensor cell that substantially reduces the leakage current associated with the silicon-to-silicon dioxide interfaces.

SUMMARY OF THE INVENTION

Conventionally, the dynamic range of an active pixel sensor cell is limited by a leakage current at the silicon-to-silicon dioxide interfaces. The present invention, however, substantially reduces the leakage current by eliminating field oxide from the cell, and by insuring that, during integration, every surface region of the cell that is not heavily doped is either biased into accumulation, or biased into inversion. Each of these states (heavily doped, accumulation, or inversion), substantially limits the number of thermally-generated electrons at the substrate surface that can contribute to the leakage current.

In the present invention, an active pixel sensor cell, which is formed on a silicon substrate, includes a first layer of dielectric material and a first overlying layer of conductive material that are formed over an isolation region of the substrate. The isolation region has an outer wall portion that encloses a plurality of active regions within the substrate, and a protruding wall portion that extends inward from the outer wall portion to define a first active region on one side of the protruding wall portion, and second, third, and fourth active regions on an opposite side of the protruding wall portion. In addition, the second and third active regions are separated by a select channel region, the third and fourth active regions are separated by a sense channel region, and the first and fourth active regions are separated by a reset channel region defined by an end of the protruding wall portion and the outer wall portion.

The active pixel sensor cell also includes a second layer of dielectric material and a second overlying layer of conductive material that are formed over a first region of the first overlying layer of conductive material formed over the outer wall portion, the reset transistor region, and a first region of the first overlying layer of conductive material formed over the protruding wall portion.

In addition, a third layer of dielectric material and a third overlying layer of conductive material are formed over an area of the first active region, a second region of the first overlying layer of conductive material formed over the protruding wall portion, the sense channel region, and a second region of the first overlying layer of conductive material formed over the outer wall portion.

Further, a fourth layer of dielectric material and a fourth overlying layer of conductive material are formed over a third region of the first overlying layer of conductive material formed over the outer wall portion, a third region of the first overlying layer of conductive material formed over the protruding wall portion, the select channel region, and a fourth region of the first overlying layer of conductive material formed over the outer wall portion.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIGS. 21A–21C are cross-sectional views taken along lines 20A—20A, 20B—20B, and 20C—20C, respectively, of FIG. 20.

FIGS. 23A–23C are cross-sectional views taken along lines 22A—22A, 22B—22B, and 22C—22C, respectively, of FIG. 22.

DETAILED DESCRIPTION

Figure 2:
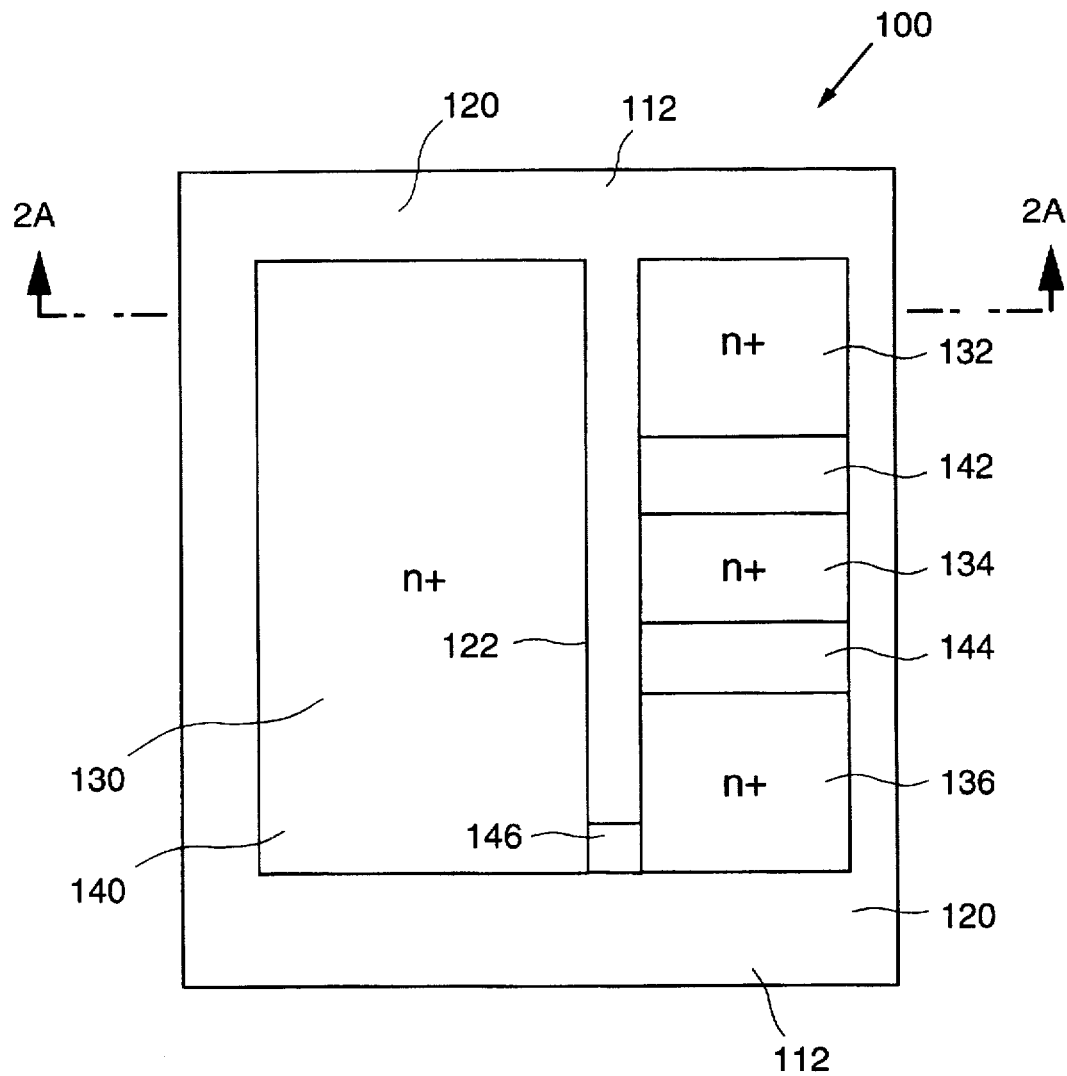
FIG. 2 is a plan view illustrating a first level of an active pixel sensor cell 100 that implements the schematic representation of cell 10 of FIG. 1 in accordance with the present invention.
Figure 3:
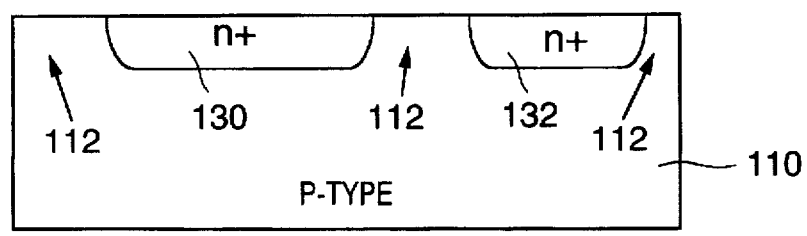
FIG. 3 is a cross-sectional view taken along line 2A—2A of FIG. 2.

FIG. 2 shows a plan view that illustrates a first level of an active pixel sensor cell 100 that implements the schematic representation of cell 10 in accordance with the present invention. FIG. 3 shows a cross-sectional view taken along line 2A—2A of FIG. 2.

As described in greater detail below, cell 100 substantially reduces the leakage current associated with the silicon-to-silicon dioxide interfaces by eliminating field oxide from cell 100, and by insuring that, during integration, every surface region of cell 100 that is not heavily doped is biased into accumulation or biased into inversion. Each of these states, in turn, substantially limits the number of thermally-generated electrons at the surface that can transition to the conduction band via the mid-band states at the silicon-to-silicon dioxide interfaces.

As shown in FIGS. 2 and 3, cell 100 is formed on a substrate 110 that includes an isolation region 112 defined by an outer wall portion 120 that encloses a plurality of active regions within substrate 110, and a protruding wall portion 122 that extends inward from the outer wall portion 120.

The protruding wall portion 122, in turn, divides the plurality of active regions into a first active region 130 on one side of wall portion 122, and second, third, and fourth active regions 132, 134, and 136 on an opposite side of wall portion 122. The first active region 130 of substrate 110 is doped with an n-type material to form an n+ photodiode 140, while the second, third, and fourth active regions 132, 134, and 136 are doped with an n-type material to form n+ source and drain regions for the transistors of cell 100.

Figure 1:
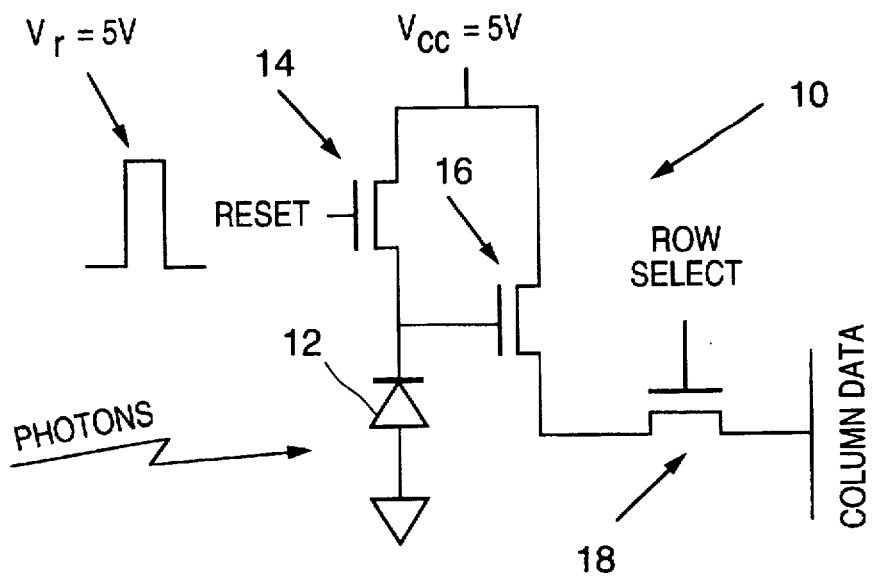
FIG. 1 is a schematic diagram illustrating a conventional active pixel sensor cell 10.

Specifically, with reference to FIGS. 1 and 2, active region 132 functions as the source of select transistor 18, active region 134 functions as the source of sense transistor 16 and the drain of select transistor 18, and active region 136 functions as the drains for reset transistor 14 and sense transistor 16.

In addition, the second and third active regions 132 and 134 are separated by a select channel region 142, the third and fourth active regions 134 and 136 are separated by a sense channel region 144, and the first and fourth active regions 130 and 136 are separated by a reset channel region 146 defined between an end of the protruding wall portion 122 and the outer wall portion 120.

Figure 4:
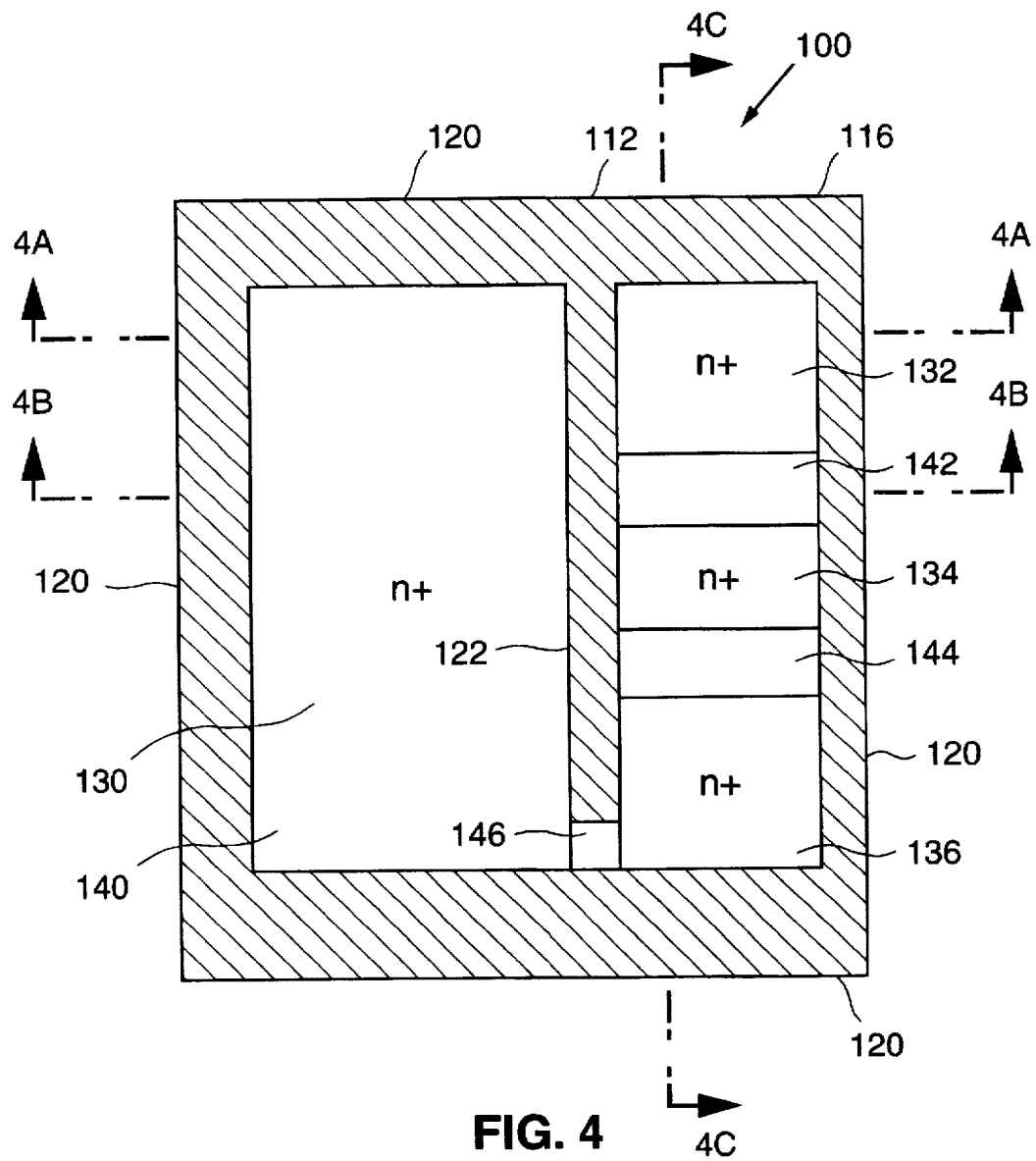
FIG. 4 is a plan view illustrating a second level of active pixel sensor cell 100 in accordance with the present invention.
Figure 5A:
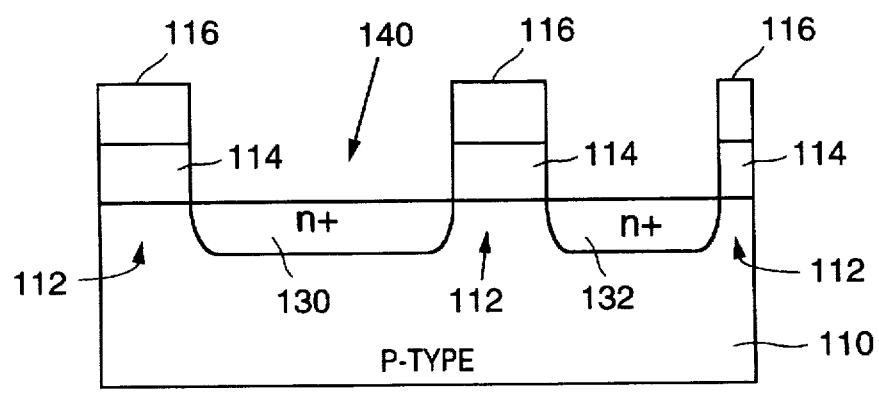
FIGS. 5A–5C are cross-sectional views taken along lines 4A—4A, 4B—4B, and 4C—4C, respectively, of FIG. 4.
Figure 5B:
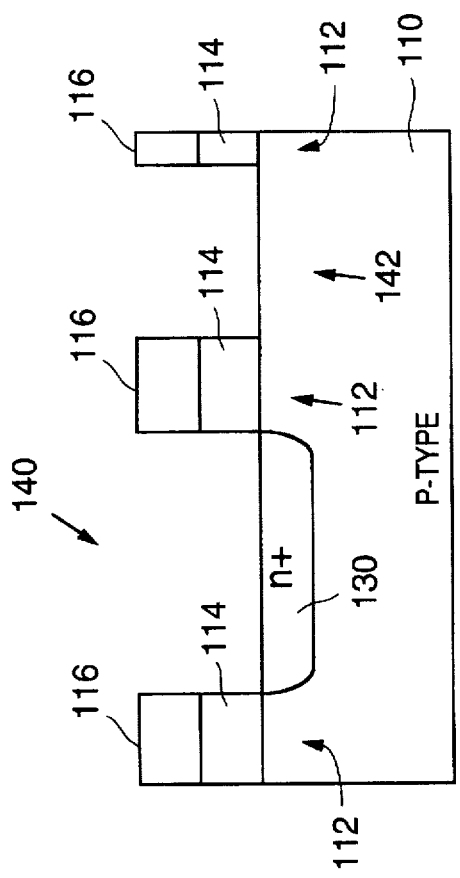
Figure 5C:
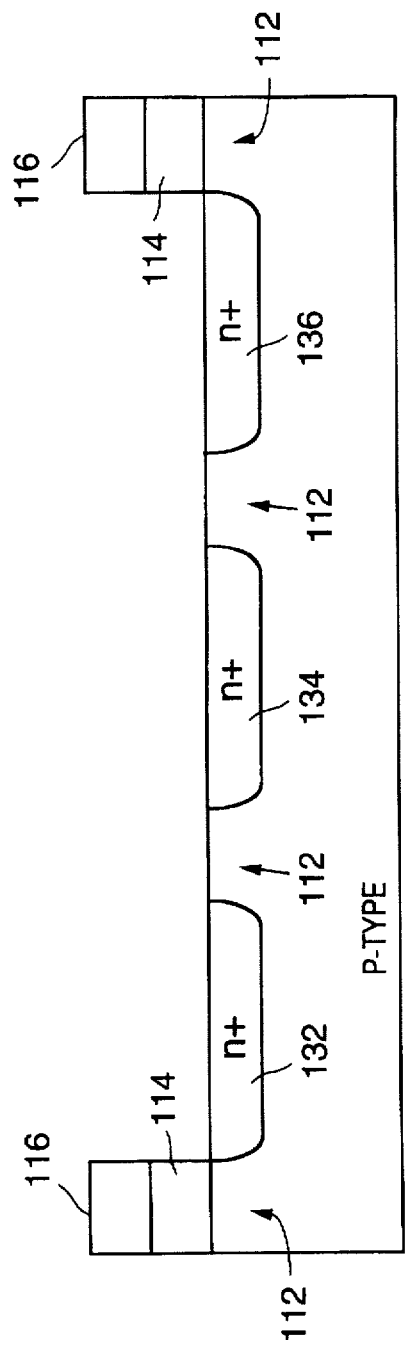

FIG. 4 shows a plan view that illustrates a second level of active pixel sensor cell 100. FIGS. 5A–5C show cross-sectional views taken along lines 4A—4A, 4B—4B, and 4C—4C, respectively.

In accordance with the present invention, as shown in FIGS. 4 and 5A–5C, active pixel sensor cell 100 further includes a first layer of polysilicon (poly-1) 116 and an underlying layer of oxide 114 that are formed over isolation region 112. As described in greater detail below, poly-1 layer 116 is negatively biased to isolate adjacent active regions from each other.

Figure 6:
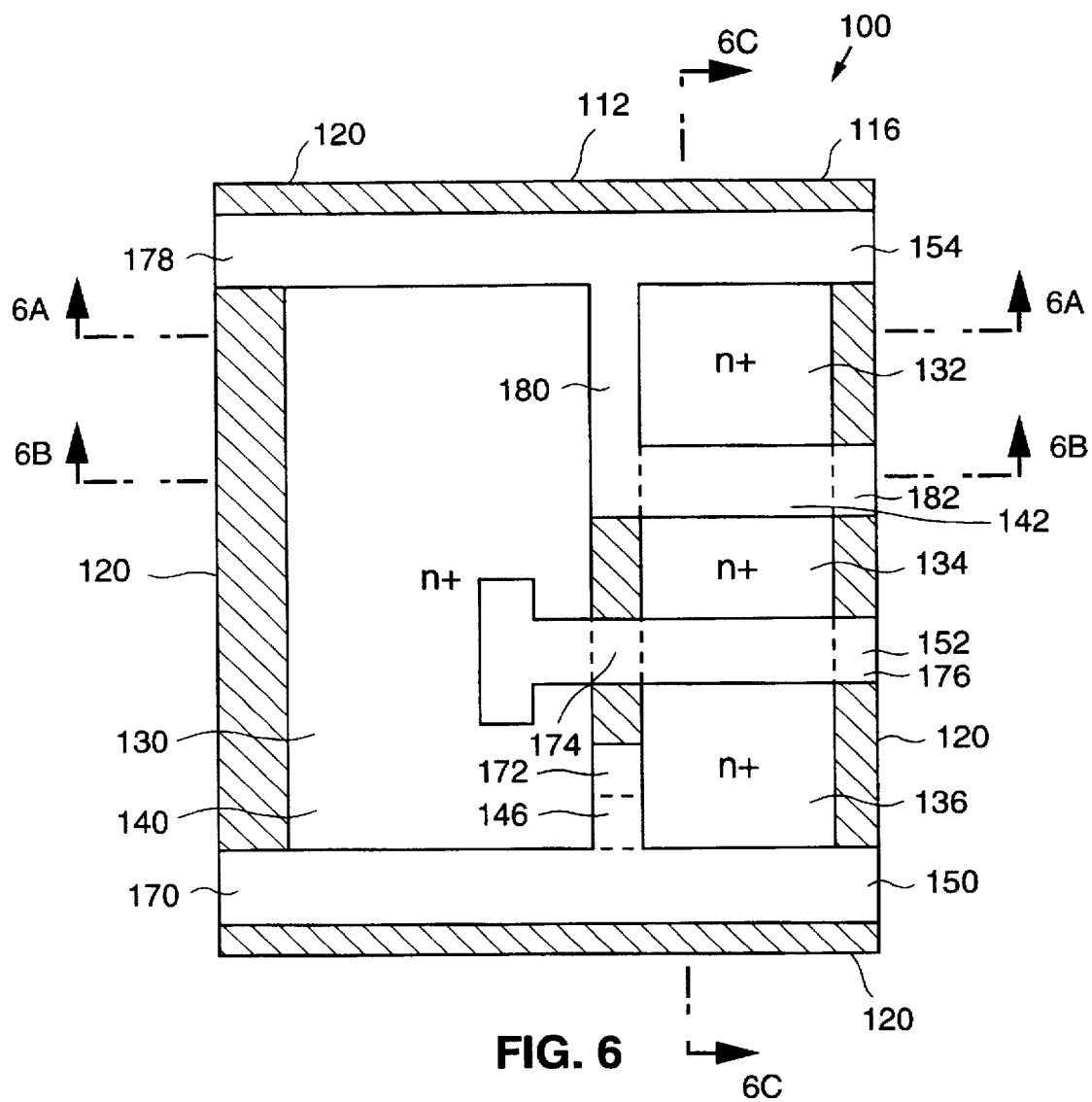
FIG. 6 is a plan view illustrating a third level of active pixel sensor cell 100 in accordance with the present invention.
Figure 7A:
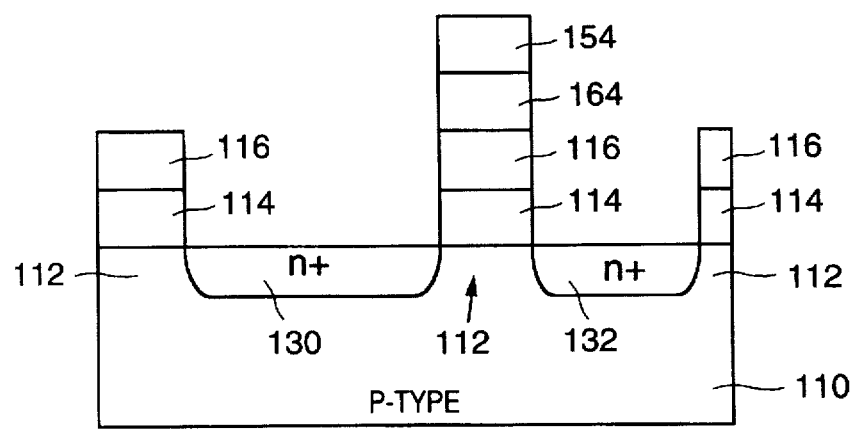
FIGS. 7A–7C are cross-sectional views taken along lines 6A—6A, 6B—6B, and 6C—6C, respectively, of FIG. 6.
Figure 7B:
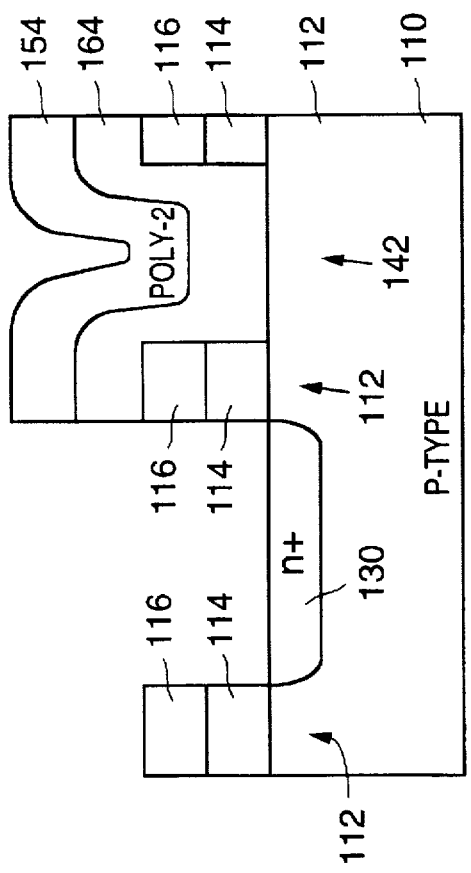
Figure 7C:
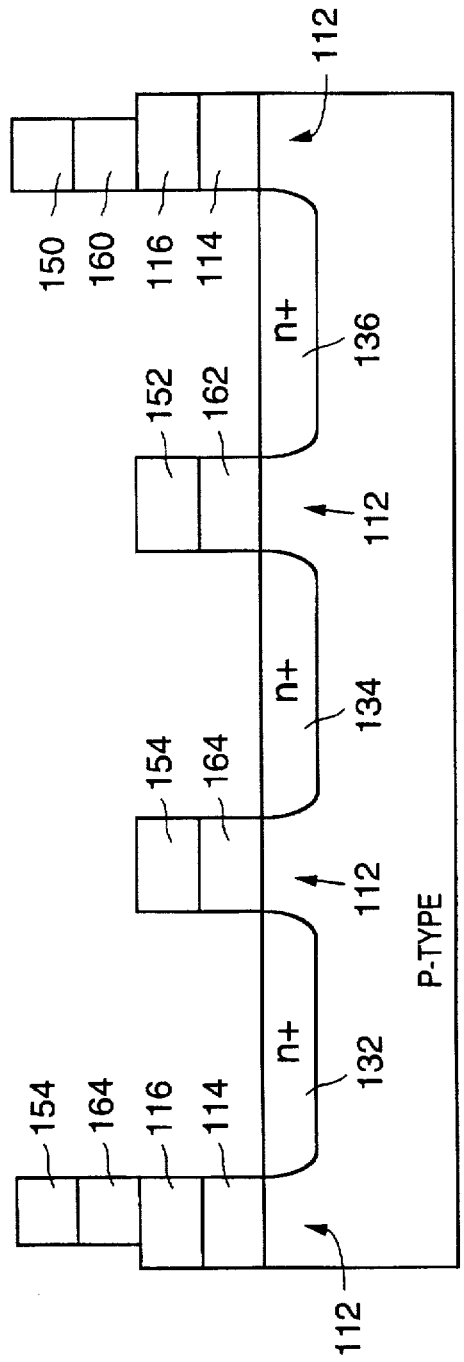

FIG. 6 shows a plan view that illustrates a third level of active pixel sensor cell 100. FIGS. 7A–7C show cross-sectional views taken along lines 6A—6A, 6B—6B, and 6C—6C, respectively.

In further accordance with the present invention, as shown in FIGS. 6 and 7A–7C, active pixel sensor cell 100 further includes a second layer of polysilicon (poly-2) which has been patterned to form three poly-2 lines; a reset line 150, a local interconnect line 152, and a select line 154. As shown, poly-2 reset line 150, and an underlying layer of oxide 160 are formed over a first region 170 of poly-1 layer 116 formed over the outer wall portion 120, the reset channel region 146, and a first region 172 of poly-1 layer 116 formed over the protruding wall portion 122. As described, reset line 150 functions as the lead-in and gate for reset transistor 14 (see FIG. 1).

The second poly-2 line, local interconnect line 152, and an underlying layer of oxide 162 are formed over a portion of the first active region 130, a second region 174 of poly-1 layer 116 formed over the protruding wall portion 122, the sense channel region 144, and a second region 176 of the poly-1 layer 116 formed over the outer wall portion 120. As described, local interconnect line 152 forms the gate of sense transistor 16 (see FIG. 1), and connects the first active area 130 to the gate of sense transistor 16.

The third poly-2 line, select line 154, and an underlying layer of oxide 164 are formed over a third region 178 of poly-1 layer 116 formed over the outer wall portion 120, a third region 180 of the protruding wall portion 122, the select channel region 142, and a fourth region 182 of poly-1 layer 116 formed over the outer wall portion 120. As described, select line 154 functions as the lead-in and gate for the select transistor 18 of FIG. 1.

Figure 8:
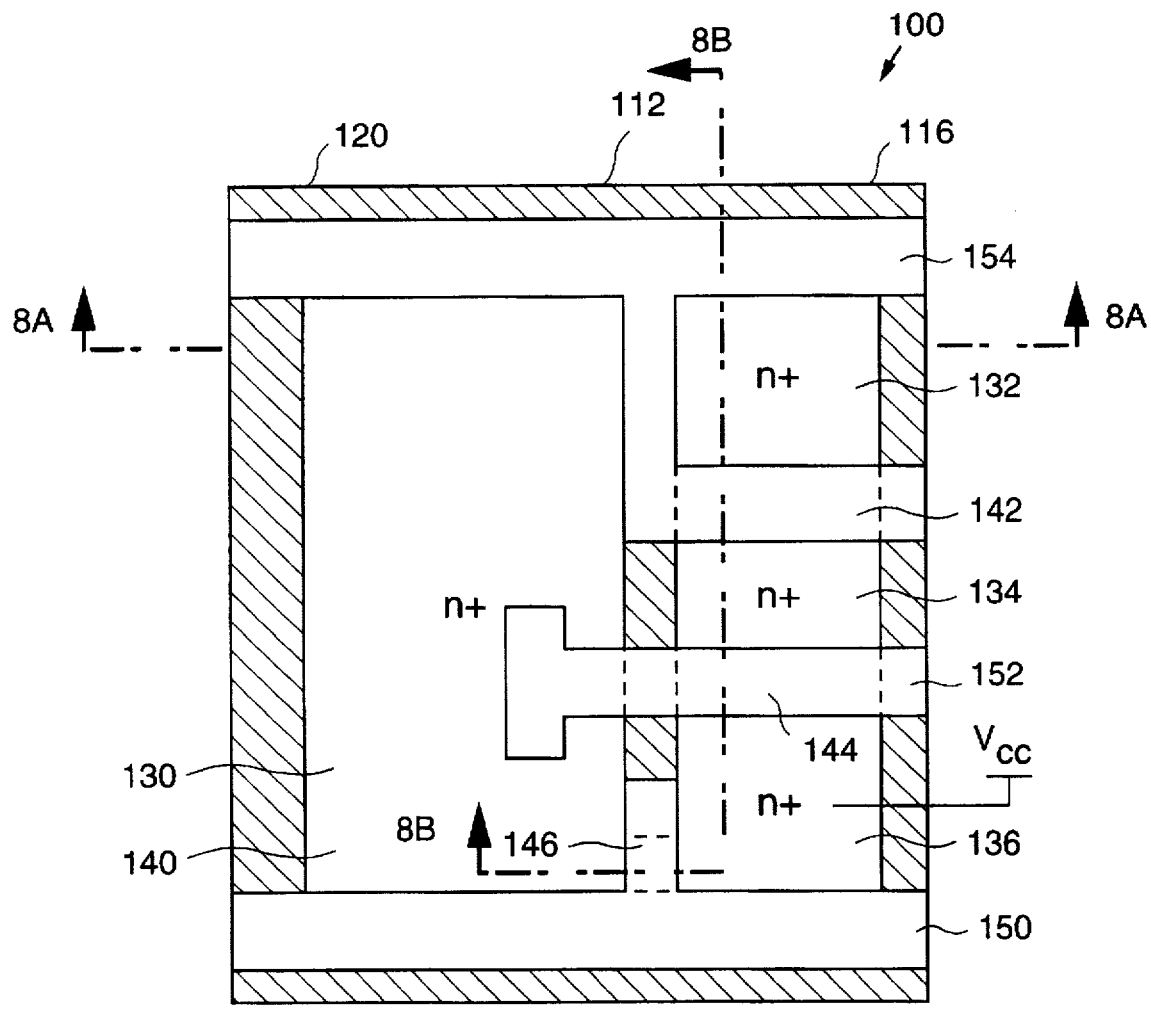
FIG. 8 is a plan view illustrating the operation of active pixel sensor cell 100 in accordance with the present invention.
Figure 9A:
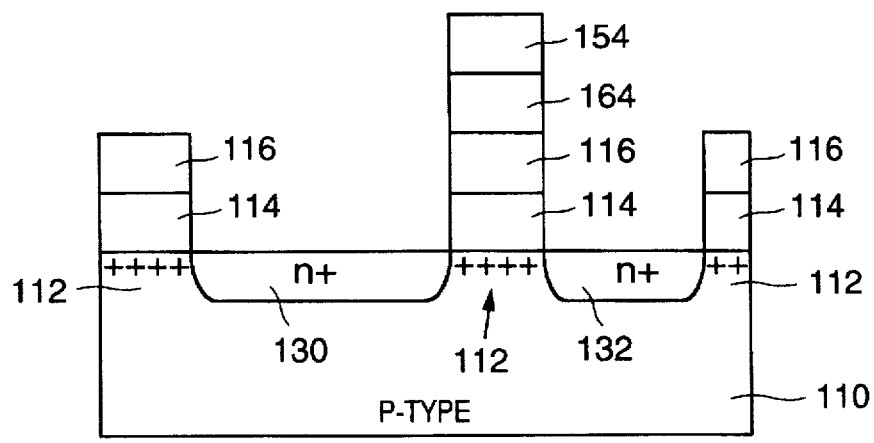
FIGS. 9A–9B are cross-sectional views taken along lines 8A—8A and 8B—8B, respectively, of FIG. 8.
Figure 9B:
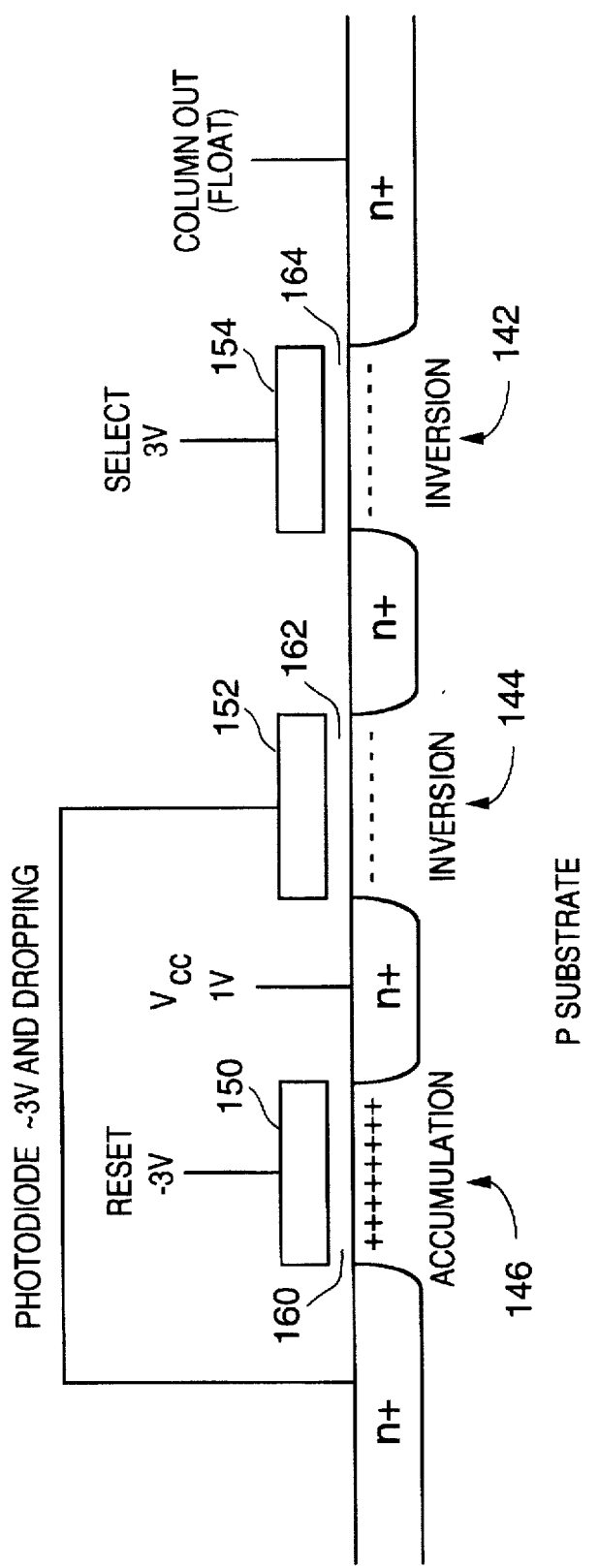

FIG. 8 shows a plan view that illustrates the operation of active pixel sensor cell 100 in accordance with the present invention. FIGS. 9A–9B show cross-sectional views taken along lines 8A—8A and 8B—8B of FIG. 8.

The operation of active pixel sensor cell 100, as with cell 10 of FIG. 1, is performed in three steps: a reset step, where cell 100 is reset from the previous integration cycle; an image integration step, where the light energy is collected and converted into an electrical signal; and a signal readout step, where the signal is read out.

In accordance with the present invention, during each of the steps, the poly-1 layer 116, which is conventionally doped; is continuously biased with a negative isolation voltage, e.g., –3 volts. Thus, as shown in FIG. 9A, positively-charged holes from substrate 110 are attracted to the surface of substrate 110 which, in turn, electrically isolate adjacent active regions from each other. As a result, poly-1 layer 116 functions as the gate of a parasitic transistor which is biased into accumulation.

In addition, due to the large number of holes that are present at the substrate surface, thermally-generated electrons at the surface will be far more likely to recombine with one of the holes than to transition from the valence band to the conduction band via the mid-band states at the substrate 110-to-oxide 114 interface.

As a result, the present invention eliminates the need for the field oxide regions that are conventionally used to isolate the n+ active regions of cell 10. By eliminating the field oxide regions, the present invention also eliminates the active area edge at the bird's beak region, thereby substantially reducing the leakage current of cell 100.

Turning now to the steps, during the reset step, active region 136, which functions as the drain for reset transistor 14 (see FIG. 1), is connected to a positive Vcc voltage, e.g. 3 volts, while reset line 150, which functions as the gate of reset transistor 14, is briefly pulsed (microseconds) with a positive reset voltage, e.g. 3 volts. The reset voltage forms a channel in reset channel region 146 which resets photodiode 140 to an initial integration voltage which is equal to $V_R$–$V_{T14}$ (e.g., approximately 3 volts), where $V_R$ represents the reset voltage, and $V_{T14}$ represents the threshold voltage of reset transistor 14.

Next, during integration, light energy, in the form of photons, strikes photodiode 140, thereby creating a number of electron-hole pairs. Photodiode 140 is designed to limit recombination between the newly formed electron-hole pairs. As a result, the photogenerated holes are attracted to substrate 110, which is grounded, while the photogenerated electrons are attracted to local interconnect line 152 where each additional electron reduces the voltage on photodiode 140.

In accordance with the present invention, as shown in FIG. 9B, during integration, the Vcc voltage is reduced, e.g., 1 volt, while a negative voltage, e.g., –3 volts, is applied to reset line 150. In addition, a positive voltage, e.g., 3 volts, is applied to select line 154.

As a result, as shown in FIG. 9B, the reset channel region 146 is biased into accumulation where positively-charged holes from substrate 110 are attracted to the surface of substrate 110. Thus, as with the substrate surface under poly-1 layer 116, the large number of holes that are present at the substrate surface of reset channel region 146 will substantially reduce the number of thermally-generated electrons that will be able to transition from the valence band to the conduction band via the mid-band states at the substrate 110-to-oxide 160 interface.

At the same time, the sense channel region 144 and the select channel region 142 are biased into inversion where a large number of negatively-charged electrons are attracted to the surface of substrate 110. These electrons fill the mid-band energy states at the substrate 110-to-oxide 162 and substrate 110-to-oxide 164 interfaces, thereby substantially reducing the likelihood that an electron from a thermally-generated electron-hole pair can transition to the conduction band via the mid-band states. In addition, by having a positive voltage on Vcc, the thermally-generated electrons at the surface will be collected by Vcc.

Following the image integration period, active pixel sensor cell 100 is read out by raising the voltage on Vcc, e.g., 3 volts, and grounding active region 132 which is connected to conventional current detectors. With these bias conditions, the reduced voltage on photodiode 140 reduces the voltage on local interconnect line 152 (the gate of sense transistor 16 of FIG. 1) which, in turn, reduces the magnitude of the current flowing through from active area 136 to active area 132 (transistors 16 and 18 of FIG. 1). The reduced current level is then detected by the conventional current detectors.

Thus, in accordance with the present invention, by utilizing a double-poly process (poly-1 and poly-2), the surface regions of substrate 110 during integration include either heavily-doped n+ active regions 130, 132, 134, and 136, surface regions biased into accumulation 112 and 146, or surface regions biased into inversion 142 and 144. By preventing any lightly doped surface regions that are not properly biased, the number of thermally-generated electrons that can transition to the conduction band via the mid-band states at the silicon-to-silicon dioxide interfaces is substantially reduced.

Figure 10:
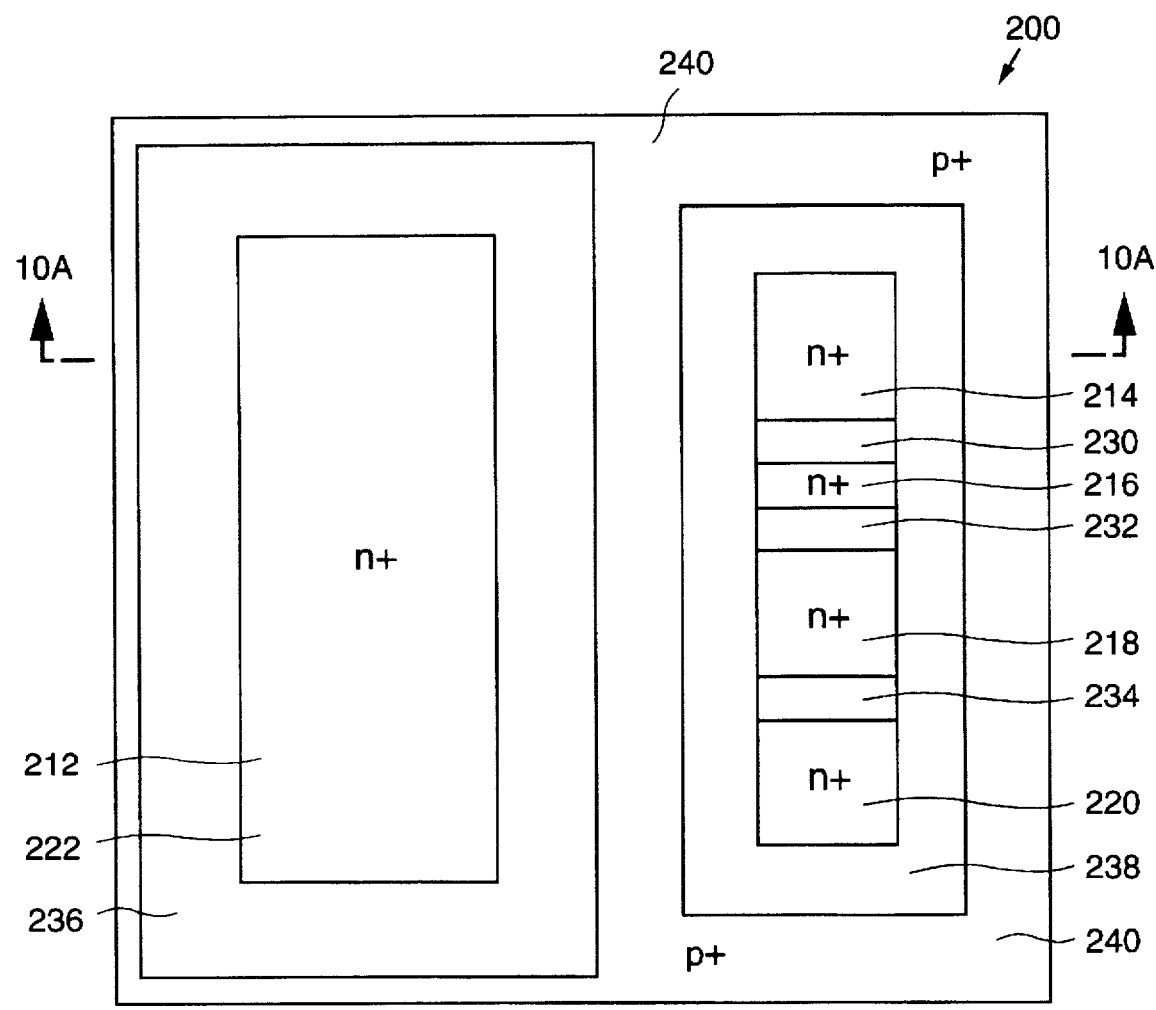
FIG. 10 is a plan view illustrating a first level of an active pixel sensor cell 200 that implements the schematic representation of cell 10 in accordance with a first alternative embodiment of the present invention.
Figure 11:
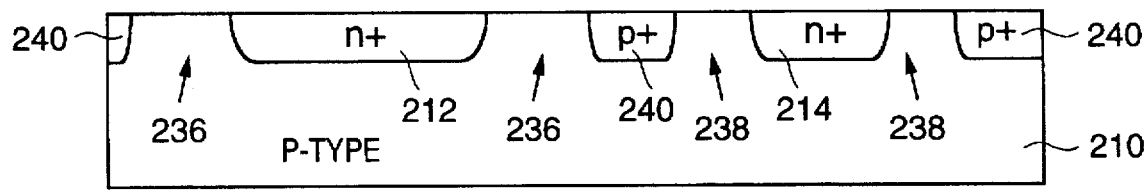
FIG. 11 is a cross-sectional view taken along lines 10A—10A of FIG. 10.

FIG. 10 shows a plan view that illustrates a first level of an active pixel sensor cell 200 that implements the schematic representation of cell 10 in accordance with a first alternative embodiment of the present invention. FIG. 11 shows a cross-sectional view taken along line 10A—10A.

As described in greater detail below, active pixel sensor cell 200 also eliminates field oxide from the cell, thereby substantially reducing the leakage at the active area edge of the bird's beak region, with a single layer of polysilicon as opposed to the two layers of polysilicon used with cell 100. In addition, although cell 200 includes lightly-doped regions of the substrate surface, these regions have been substantially minimized.

As shown in FIGS. 10 and 11, active pixel sensor cell 200 is formed in a substrate 210 that includes first, second, third, fourth, and fifth active regions 212, 214, 216, 218, and 220. The first active region 212 of substrate 210 is doped with an n-type material to form an n+ photodiode 222, while the second, third, fourth, and fifth active regions 214, 216, 218, and 220 are doped with an n-type material to form n+ source and drain regions for the transistors of cell 200.

Specifically, with reference to FIGS. 1 and 10, active region 214 functions as the source of select transistor 18, active region 216 functions as the source of sense transistor 16 and the drain of select transistor 18, active region 218 functions as the drains for reset transistor 14 and sense transistor 16, and active region 220 functions as the source for reset transistor 14.

In addition, the second and third active regions 214 and 216 are separated by a select channel region 230, the third and fourth active regions 216 and 218 are separated by a sense channel region 232, and the fourth and fifth active regions 218 and 220 are separated by a reset channel region 234.

As further shown in FIG. 10, cell 200 also includes a lightly-doped exposed surface region 238 of substrate 210 that surrounds a substrate area that includes second, third, fourth, and fifth active regions 214, 216, 218, and 220, and the select, sense, and reset channel regions 230, 232, and 234. In accordance with the present invention, cell 200 further includes an isolation region 236 of substrate 210 that surrounds active region 212, and a p+ region 240 formed in substrate 210 that surrounds both isolation region 236 and exposed surface region 238.

Figure 12:
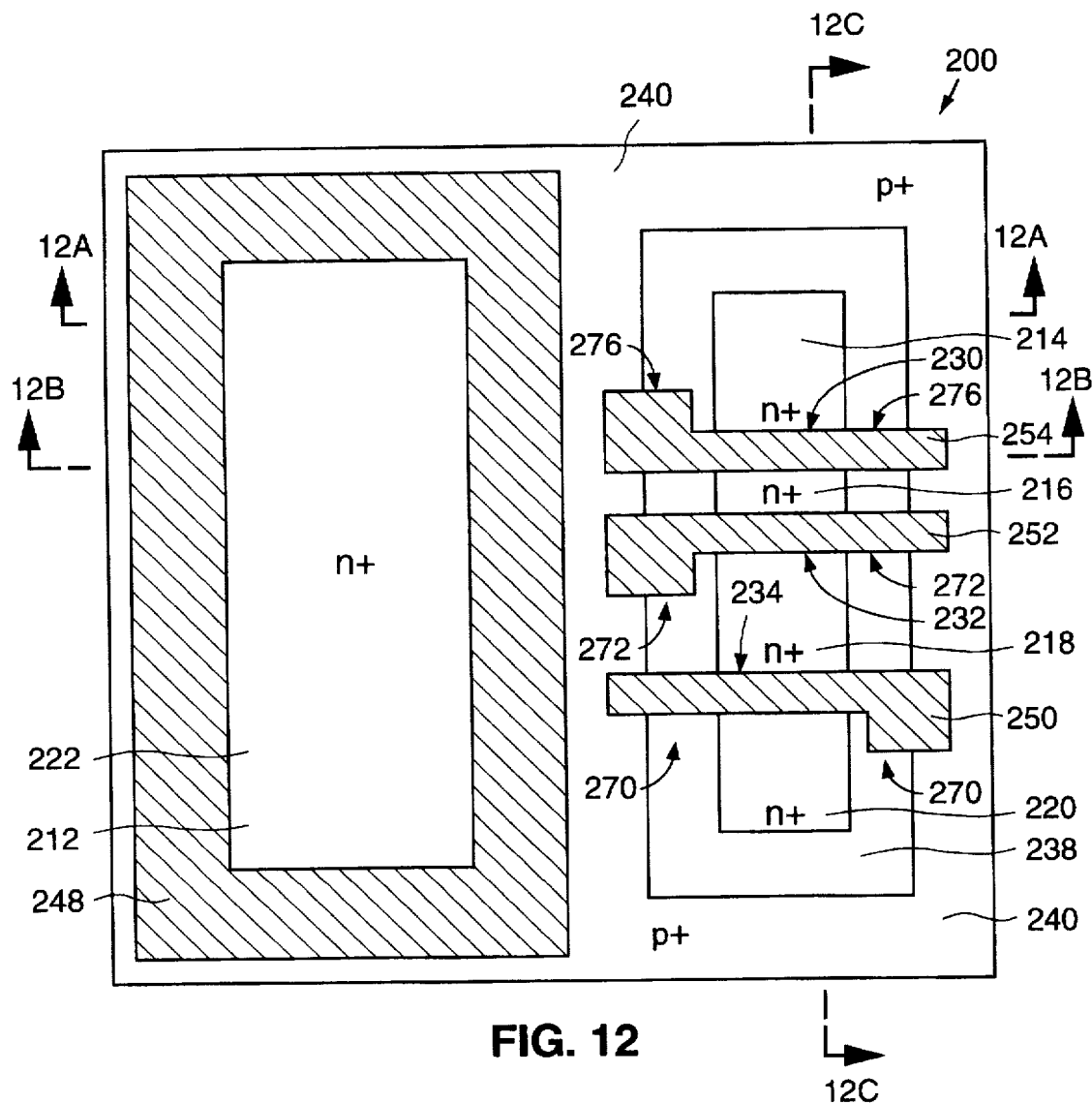
FIG. 12 is a plan view illustrating a second level of active pixel sensor cell 200 in accordance with the first alternative embodiment of the present invention.
Figure 13A:
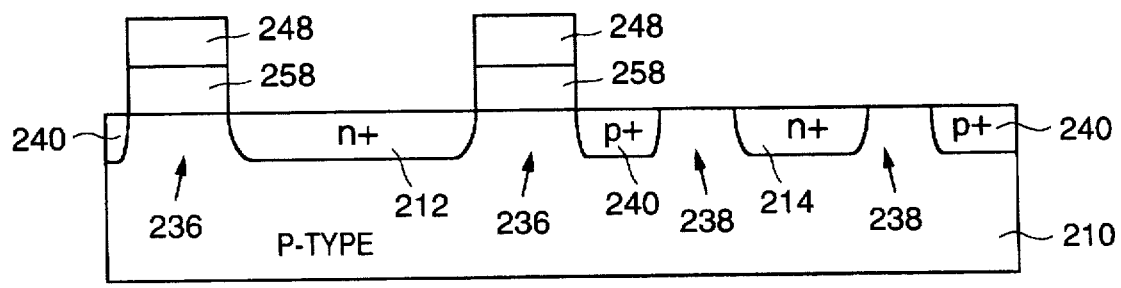
FIGS. 13A–13C are cross-sectional views taken along lines 12A—12A, 12B—12B, and 12C—12C, respectively, of FIG. 12.
Figure 13B:
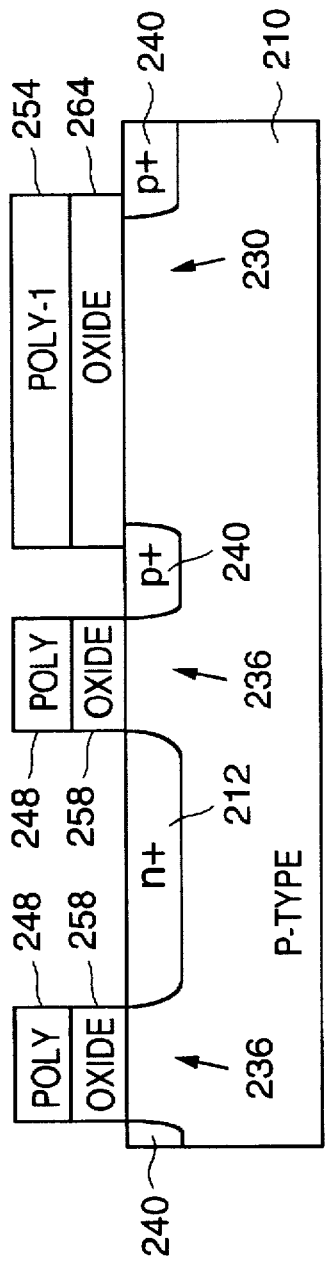
Figure 13C:
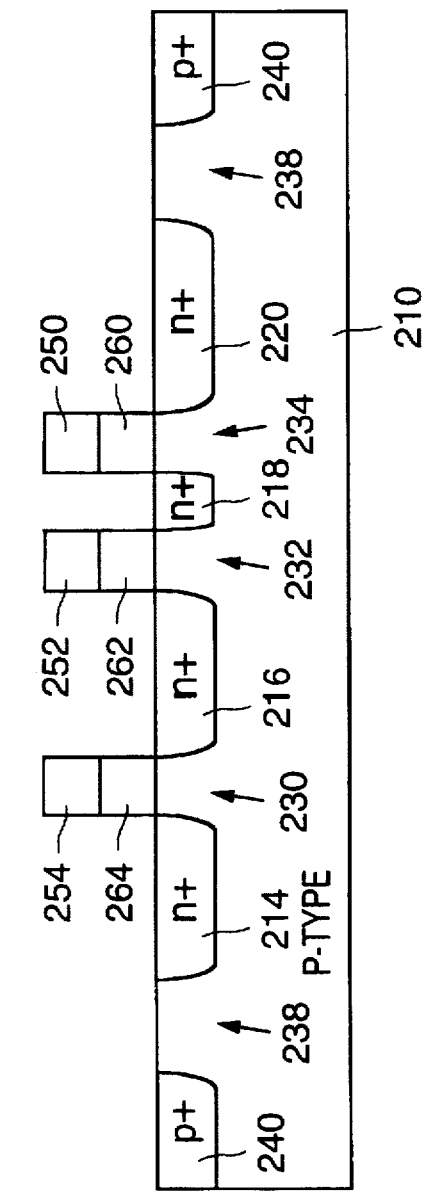

FIG. 12 shows a plan view that illustrates a second level of active pixel sensor cell 200. FIGS. 13A–13C show cross-sectional views taken along lines 12A—12A, 12B—12B, and 12C—12C, respectively.

In further accordance with the present invention, as shown in FIGS. 12 and 13A–13C, cell 200 additionally includes a layer of polysilicon (poly-1) which has been patterned to form four poly-1 lines; an isolation line 248, a reset line 250, a sense line 252, and a select line 254. As shown, poly-1 isolation line 248 and a first underlying layer of oxide 258 are formed over isolation region 236.

The second poly-1 line, reset line 250, and an underlying layer of oxide 260 are formed over first regions 270 of the exposed substrate region 238 and the reset channel region 234. As described, reset line 250 functions as the gate for reset transistor 14 (see FIG. 1).

The third poly-1 line, sense line 252, and an underlying layer of oxide 262 are formed over second regions 272 of the exposed substrate region 238 and the sense channel region 232. As described, the sense line 252 forms the gate of sense transistor 16 (see FIG. 1). The fourth poly-1 line, select line 254, and an underlying layer of oxide 264 are formed over third regions 276 of the exposed substrate region 238 and the select channel region 230. As described, select line 254 functions as the gate for select transistor 18 (see FIG. 1).

Figure 14:
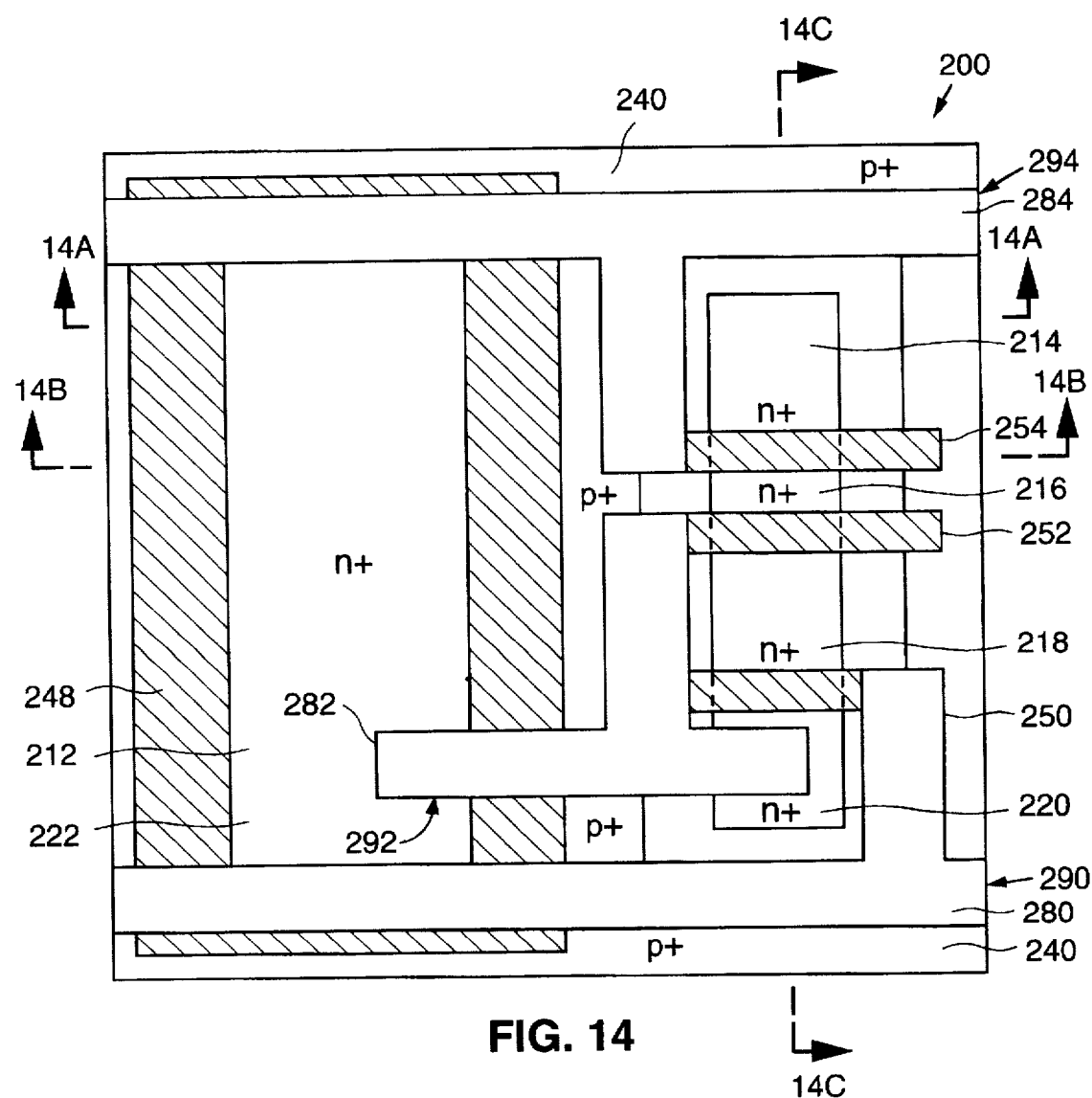
FIG. 14 is a plan view illustrating a third level of active pixel sensor cell 200 in accordance with the first alternative embodiment of the present invention.
Figure 15A:
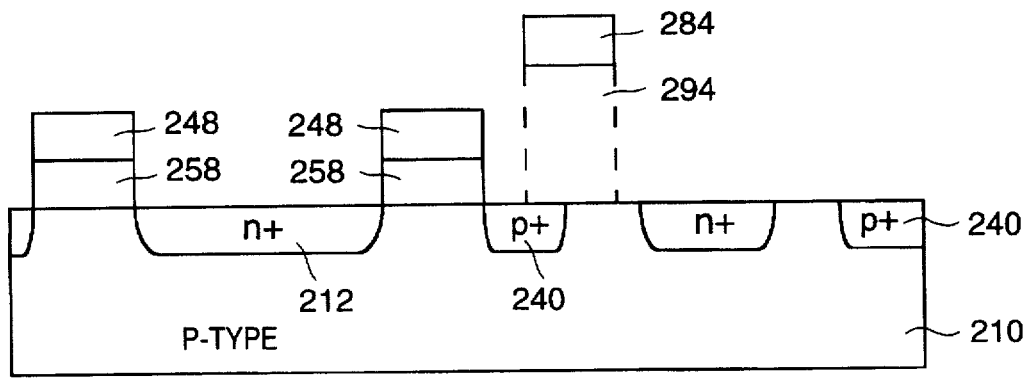
FIGS. 15A–15C are cross-sectional views taken along lines 14A—14A, 14B—14B, and 14C—14C, respectively, of FIG. 14.
Figure 15B:
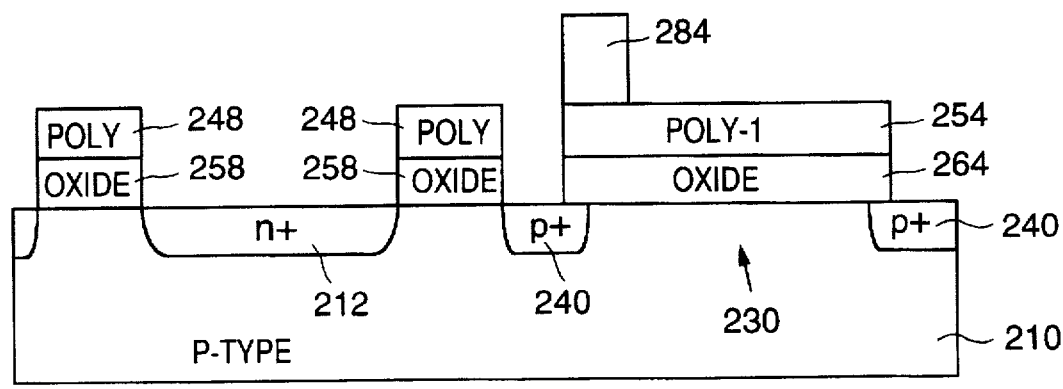
Figure 15C:
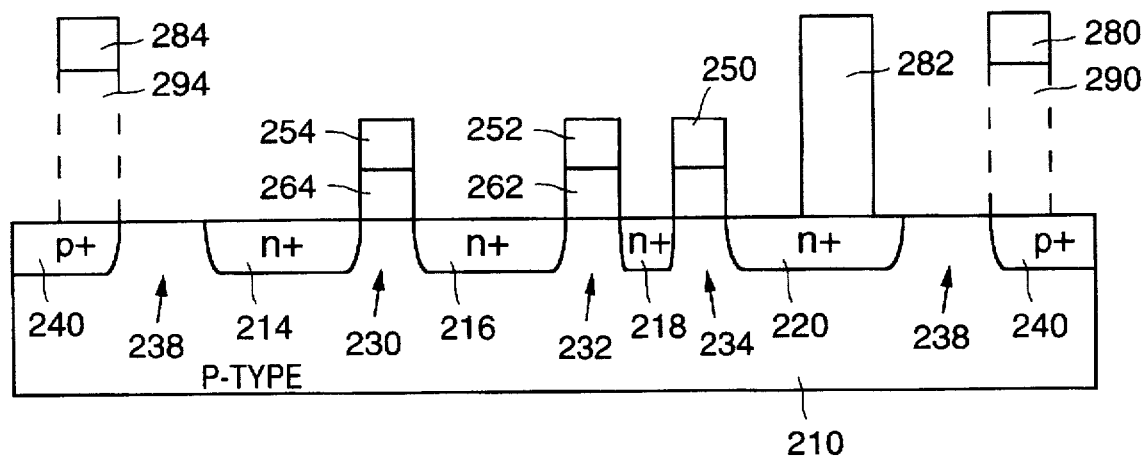

FIG. 14 shows a plan view that illustrates a third level of active pixel sensor cell 200 in accordance with the present invention. FIGS. 15A–15C show cross-sectional views taken along lines 14A—14A, 14B—14B, and 14C—14C, respectively.

As shown in FIGS. 14 and 15A–15C, cell 200 further includes a layer of metal (metal-1) which has been patterned to form three metal-1 lines; a reset line 280, a sense line 282, and a select line 284.

The first metal-1 line, reset line 280, which is isolated with an underlying layer of oxide 290, is used to contact reset line 250, while metal-1 select line 284, which is also isolated with an underlying layer of oxide 294, is used to contact sense line 254. In addition, metal-1 line 282, which is additionally isolated with an underlying layer of oxide 292, is used to contact first active region 212, fifth active region 220, and sense line 252.

Figure 17B:
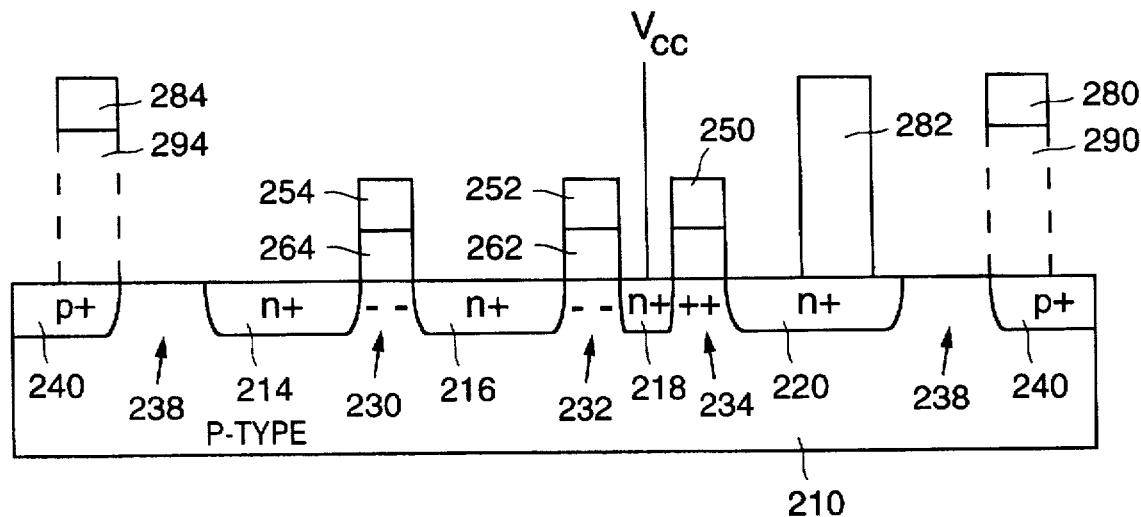
FIGS. 17A–17B are cross-sectional views taken along lines 16A—16A and 16B—16B, respectively, of FIG. 16.
Figure 16:
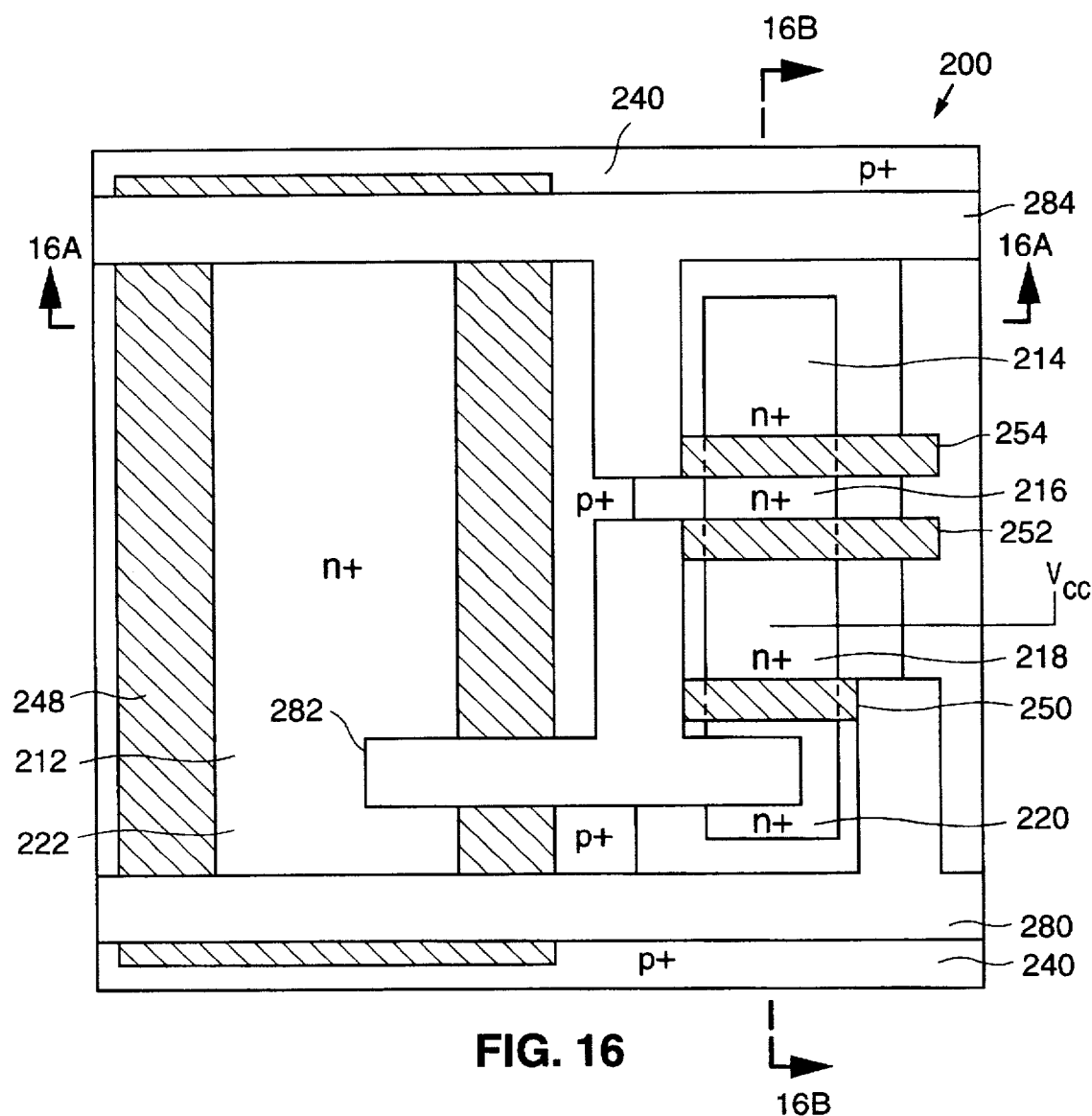
FIG. 16 is a plan view illustrating the operation of active pixel sensor cell 200 in accordance with the first alternative embodiment of the present invention.
Figure 17A:
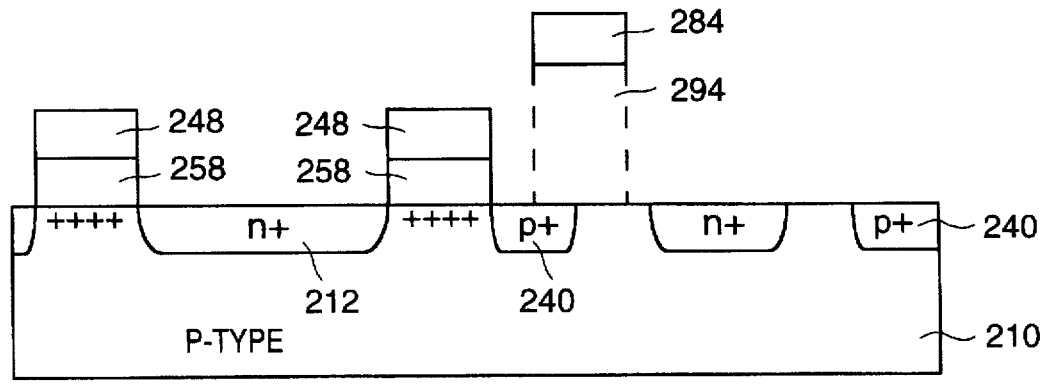

FIG. 16 shows a plan view that illustrates the operation of active pixel sensor cell 200 in accordance with the present invention. FIGS. 17A–17B show cross-sectional views taken along lines 16A—16A and 16B—16B of FIG. 16.

The operation of active pixel sensor cell 200, as with cell 10 of FIG. 1 and cell 100 of FIG. 6, is performed in three steps: a reset step; an image integration step; and a signal readout step.

In accordance with the present invention, during each of the steps, the poly-1 layer 248, which is conventionally doped, is continuously biased with a negative isolation voltage, e.g., −3 volts. Thus, as shown in FIG. 17A, positively-charged holes from substrate 210 are attracted to the surface of substrate 210 which, in turn, electrically isolate adjacent active regions from each other.

In addition, due to the large number of holes that are present at the substrate surface, thermally-generated electrons at the surface will be far more likely to recombine with one of the holes than to transition from the valence band to the conduction band via the mid-band states at the substrate 210-to-oxide 258 interface.

As a result, the first alternative embodiment of the present invention also eliminates the need for the field oxide regions that are conventionally used to isolate the n+ active regions of cell 10. By eliminating the field oxide regions, the present invention also eliminates the active area edge at the bird's beak region, thereby substantially reducing the leakage current of cell 200.

Turning now to the steps, during the reset step, active region 218, which functions as the drain for reset transistor 14 (see FIG. 1), is connected to a positive Vcc voltage, e.g. 3 volts, while reset line 280, which functions as the gate of reset transistor 14, is briefly pulsed (microseconds) with a positive reset voltage, e.g. 3 volts. The reset voltage forms a channel in reset channel region 234 which resets photodiode 222 to an initial integration voltage which is equal to $V_R - V_{T14}$ (e.g., approximately 3 volts), where $V_R$ represents the reset voltage, and $V_{T14}$ represents the threshold voltage of reset transistor 14.

Next, during integration, light energy, in the form of photons, strikes photodiode 222, thereby creating a number of electron-hole pairs. Photodiode 222 is also designed to limit recombination between the newly formed electron-hole pairs. As a result, the photogenerated holes are attracted to substrate 210, which is grounded, while the photogenerated electrons are attracted to sense line 282 where each additional electron reduces the voltage on photodiode 222.

In accordance with the first alternative embodiment of the present invention, during integration, the Vcc voltage is reduced, e.g., 1 volt, while a negative voltage, e.g., −3 volts, is applied to reset line 280. In addition, a positive voltage, e.g., 3 volts, is applied to select line 284.

As a result, as with cell 100, the reset channel region 234 is biased into accumulation where positively-charged holes from substrate 210 are attracted to the surface of substrate 210. Thus, the large number of holes that are present at the substrate surface of reset channel region 234 will substantially reduce the number of thermally-generated electrons that will be able to transition from the valence band to the conduction band via the mid-band states at the substrate 210-to-oxide 260 interface.

At the same time, the sense channel region 232 and the select channel region 230 are biased into inversion where a large number of negatively-charged electrons are attracted to the surface of substrate 210. These electrons fill the mid-band energy states at the substrate 210-to-oxide 262 and substrate 210-to-oxide 264 interfaces, thereby substantially reducing the likelihood that an electron from a thermally-generated electron-hole pair can transition to the conduction band via the mid-band states. In addition, by having a positive voltage on Vcc, the thermally-generated electrons at the surface will be collected by Vcc.

Following the image integration period, active pixel sensor cell 200 is read out by raising the voltage on Vcc, e.g., 3 volts, and grounding active region 214 which is connected to conventional current detectors. With these bias conditions, the reduced voltage on photodiode 222 reduces the voltage on sense line 252 (the gate of sense transistor 16 of FIG. 1) which, in turn, reduces the magnitude of the current flowing through from active area 218 to active area 214 (transistors 16 and 18 of FIG. 1). The reduced current level is then detected by the conventional current detectors.

Thus, in accordance with the first alternative embodiment of the present invention, an active pixel sensor cell has been described that also eliminates the field oxide regions and only utilizes a single layer of poly. By utilizing a single layer of poly, the first alternative embodiment simplifies the fabrication process. However, since cell 200 includes exposed surface region 238, cell 200 provides less isolation than cell 100.

Figure 18:
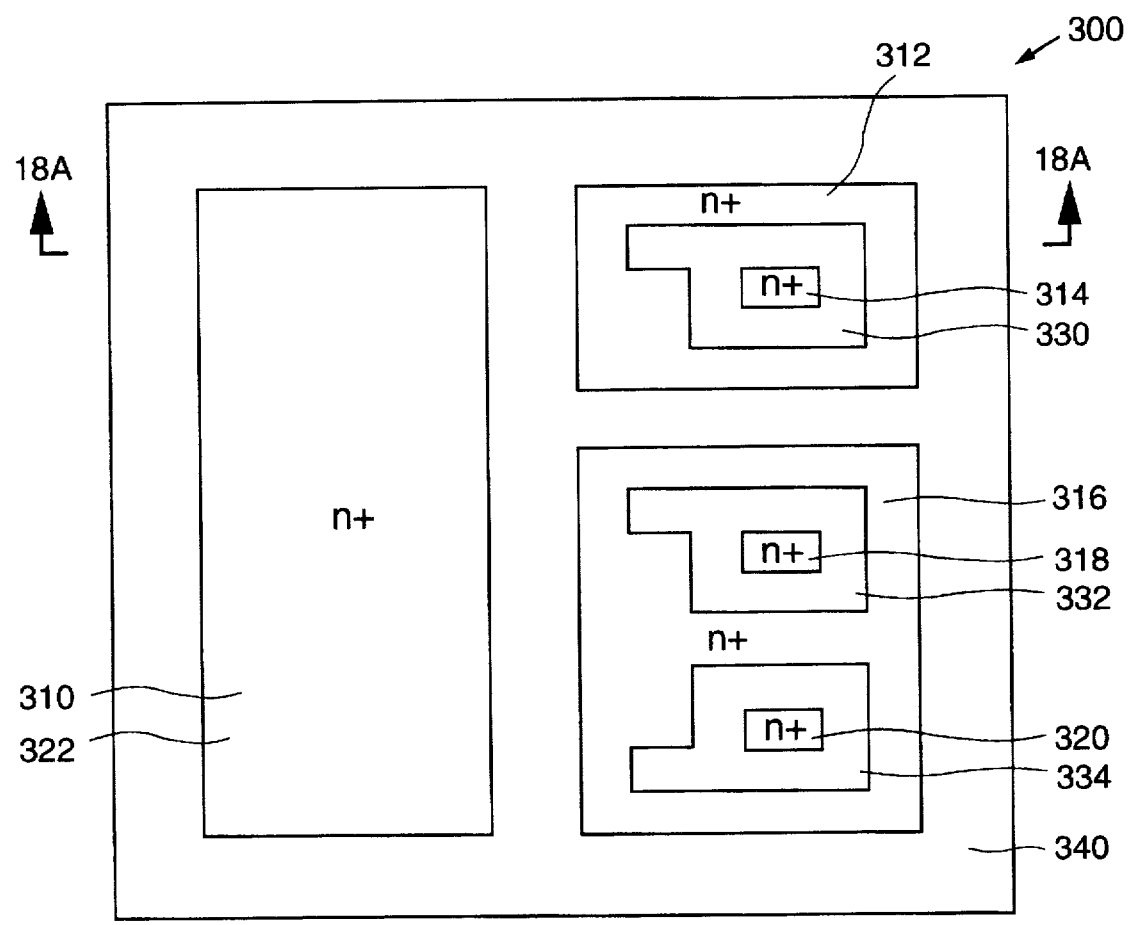
FIG. 18 is a plan view illustrating a first level of an active pixel sensor cell 300 that implements the schematic representation of cell 10 in accordance with a second alternative embodiment of the present invention.
Figure 19:
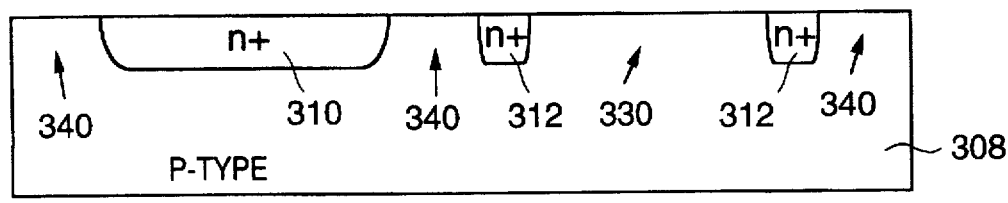
FIG. 19 is a cross-sectional view taken along lines 18A—18A of FIG. 19.

FIG. 18 shows a plan view that illustrates a first level of an active pixel sensor cell 300 that implements the schematic representation of cell 10 in accordance with a second alternative embodiment of the present invention. FIG. 19 shows a cross-sectional view taken along lines 18A—18A.

As described in greater detail below, active pixel sensor cell 300 also eliminates field oxide from the cell, thereby substantially reducing the leakage at the active area edge of the bird's beak region, with a single layer of polysilicon as opposed to the two layers of polysilicon used with cell 100. In addition, although cell 300 consumes significantly more silicon real estate than cell 100 or cell 200, cell 300 also insures that, during integration, every surface region of cell 300 that is not heavily doped is biased into accumulation or inversion.

As shown in FIGS. 18 and 19A-19C, active pixel sensor cell 300 is formed in a substrate 308 that includes first, second, third, fourth, fifth, and sixth active regions 310, 312, 314, 316, 318, and 320. The first active region 310 of substrate 308 is doped with an n-type material to form an n+ photodiode 322, while the second, third, fourth, fifth, and sixth active regions 312, 314, 316, 318, and 320 are doped with an n-type material to form n+ source and drain regions for the remaining transistors of cell 300.

Specifically, with reference to FIGS. 1 and 18, active region 312 functions as the source of reset transistor 14, active region 314 functions as the drain of reset transistor 14, active region 316 functions as the source of sense transistor 16 and the drain of select transistor 18, active region 318 functions as the drain for sense transistor 16, and active region 320 functions as the source for select transistor 18.

In addition, the second and third active regions 312 and 314 are separated by an annular reset channel region 330, the fourth and fifth active regions 316 and 318 are separated by an annular sense channel region 332, and the fourth and sixth active regions 316 and 320 are separated by a sense channel region 334. In accordance with the present invention, cell 300 further includes an isolation region 340 of substrate 308 that surrounds active regions 310, 312, and 316.

Figure 20:
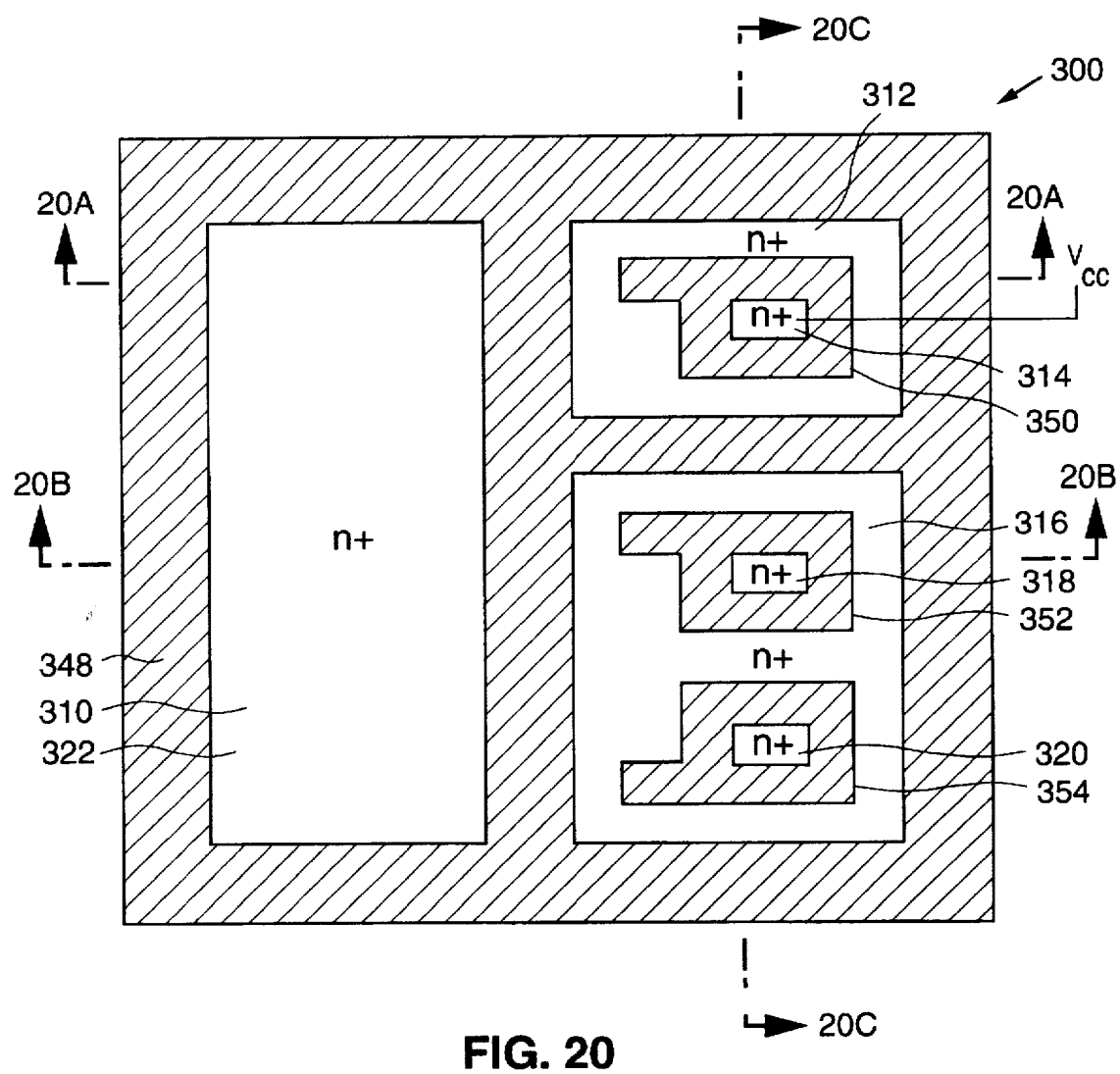
FIG. 20 is a plan view illustrating a second level of active pixel sensor cell 300 in accordance with the second alternative embodiment of the present invention.
Figure 21A:
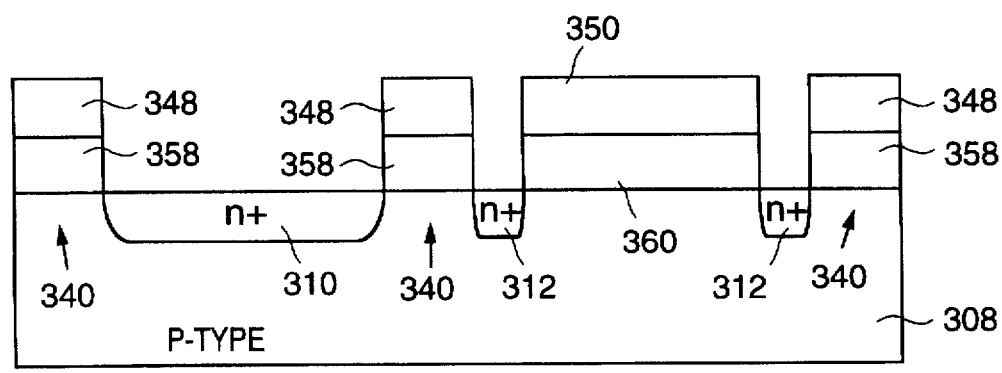

FIG. 20 shows a plan view that illustrates a second level of active pixel sensor cell 300. FIGS. 21A–21C show cross-sectional views taken along lines 20A—20A, 20B—20B, and 20C—20C, respectively.

In further accordance with the present invention, as shown in FIGS. 20 and 21A-21C, cell 300 additionally includes a layer of polysilicon (poly-1) which has been patterned to form four poly-1 lines; an isolation line 348, an annular reset gate 350, an annular sense gate 352, and an annular select gate 354. As shown, poly-1 isolation line 348 and a first underlying layer of oxide 358 are formed over isolation region 340 of substrate 308 to surround the first active region 310, the second active region 312, and the fourth active region 316.

The second poly-1 line, reset gate 350, and an underlying layer of oxide 360 are formed over the annular reset channel region 330. The third poly-1 line, sense gate 352, and an underlying layer of oxide 362 are formed over the annular sense channel region 334. The fourth poly-1 line, select line 354, and an underlying layer of oxide 364 are formed over the annular select channel region 336.

Figure 22:
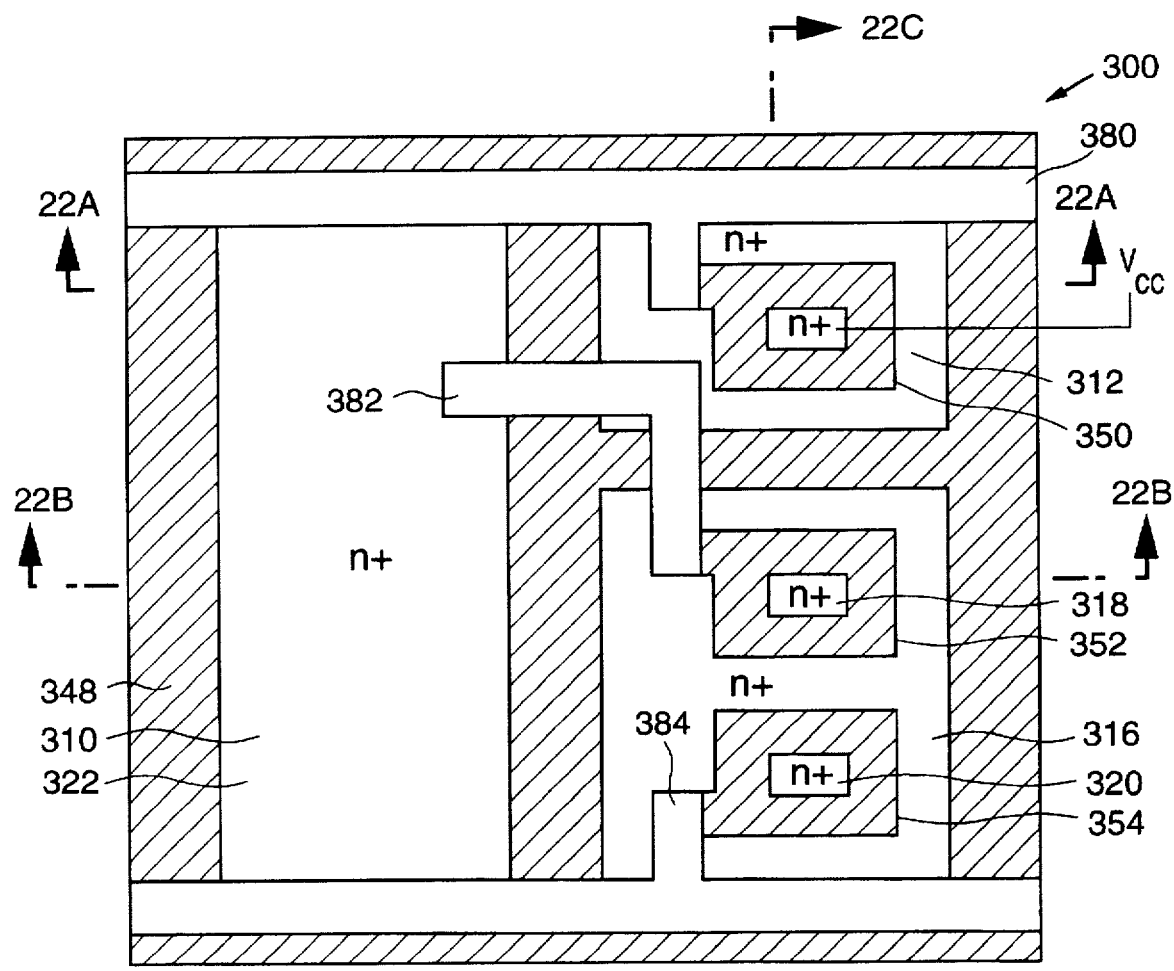
FIG. 22 is a plan view illustrating a third level of active pixel sensor cell 300 in accordance with the second alternative embodiment of the present invention.
Figure 23A:
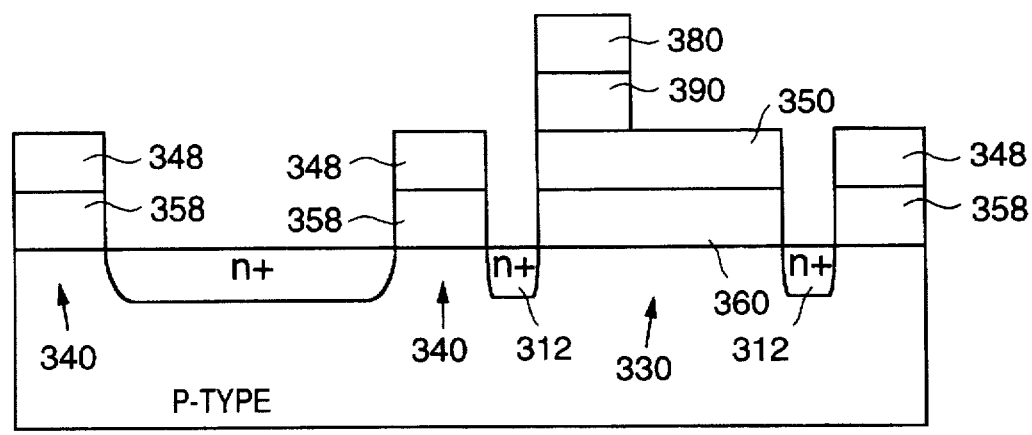

FIG. 22 shows a plan view that illustrates a third level of active pixel sensor cell 300 in accordance with the present invention. FIGS. 23A-23C show cross-sectional views taken along lines 22A—22A, 22B—22B, and 22C—22C, respectively.

As shown in FIGS. 22 and 23A-23C, cell 300 further includes a layer of metal (metal-1) which has been patterned to form three metal-1 lines; a reset line 380, a sense line 382, and a select line 384.

The first metal-1 line, reset line 380, which is isolated with an underlying layer of oxide 390, is used to contact reset gate 350, while metal-1 select line 384, which is also isolated with an underlying layer of oxide 394, is used to contact sense gate 354. In addition, metal-1 line 382, which is additionally isolated with an underlying layer of oxide 392, is used to connect second active region 312 with sense gate 352 and first active region 310.

Figure 24:
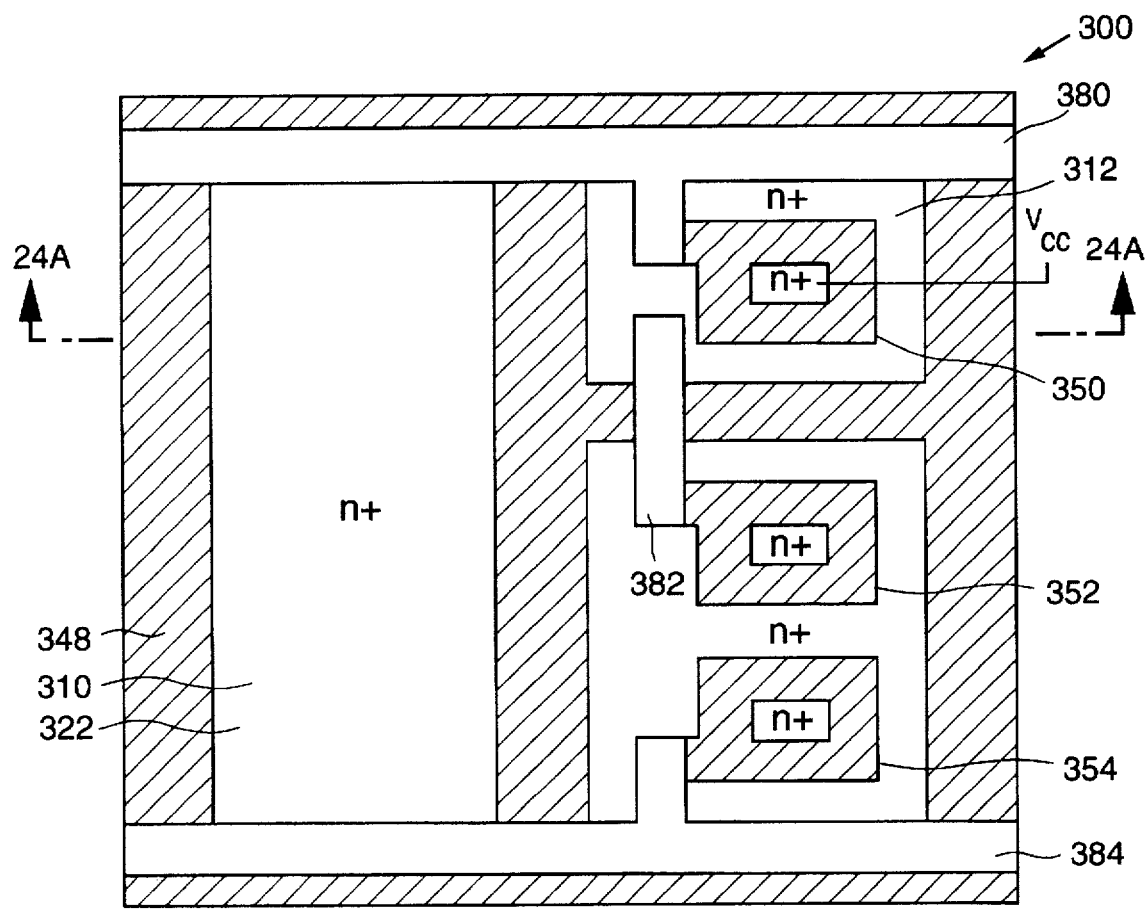
FIG. 24 is a plan view illustrating an alternative arrangement of active pixel sensor cell 300 in accordance with the second alternative embodiment of the present invention.
Figure 25:
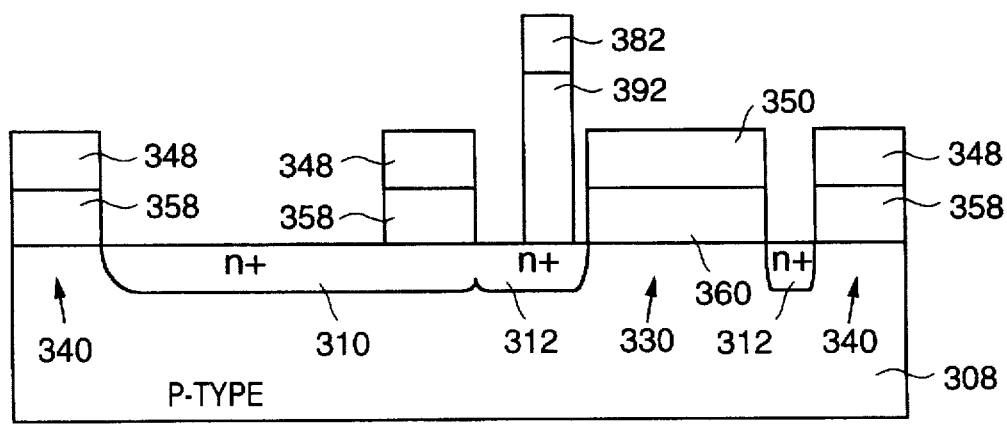
FIGS. 25 is a cross-sectional view taken along lines 24A—24A of FIG. 24.

Alternately, as shown in FIGS. 24 and 25, rather than using metal-1 line 382 to connect first active region 310 to second active region 312, n+ active regions 310 and 312 can be formed so that the two regions diffuse together so that the voltage on active region 312 is also on active region 310.

Figure 26:
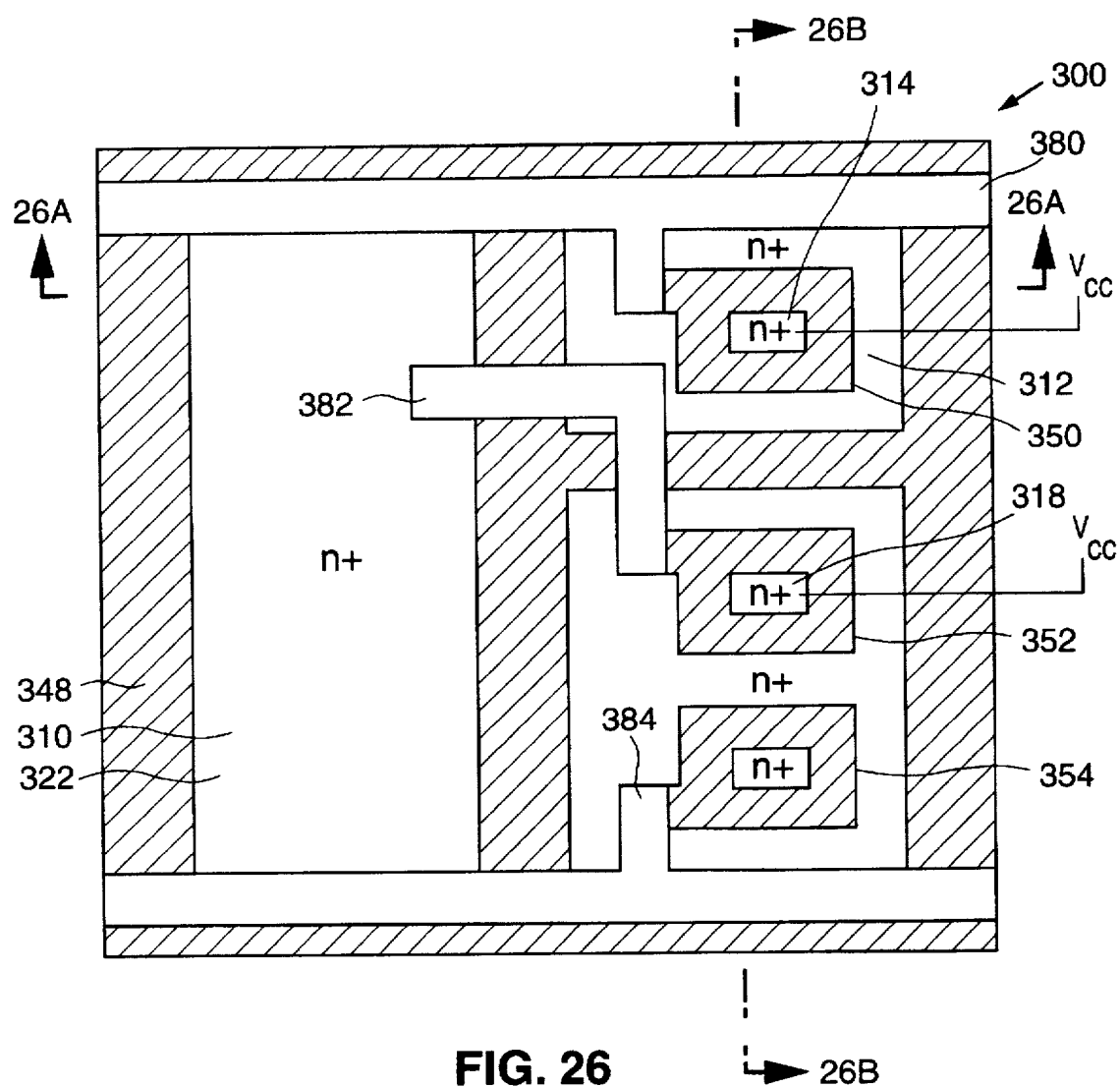
FIG. 26 is a plan view illustrating the operation of active pixel sensor cell 300 in accordance with the second alternative embodiment of the present invention.
Figure 27A:
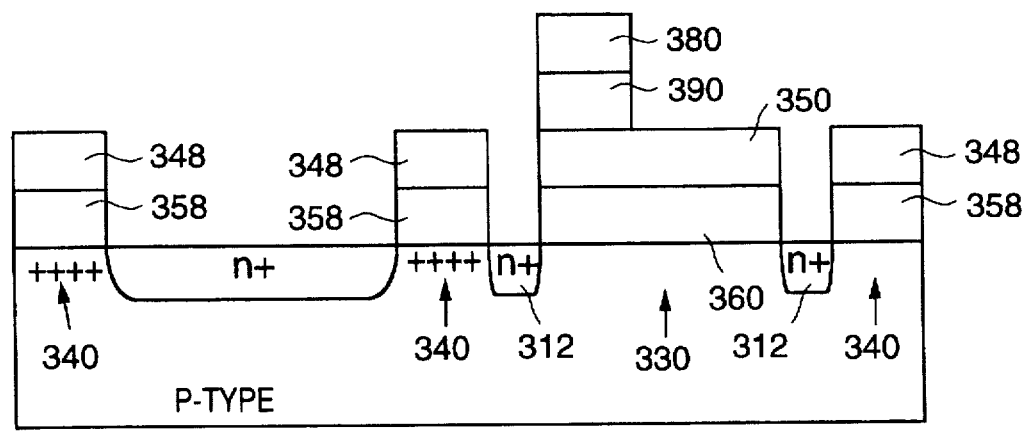
FIGS. 27A-27B are cross-sectional views taken along lines 26A—26A and 26B—26B, respectively, of FIG. 26.
Figure 27B:
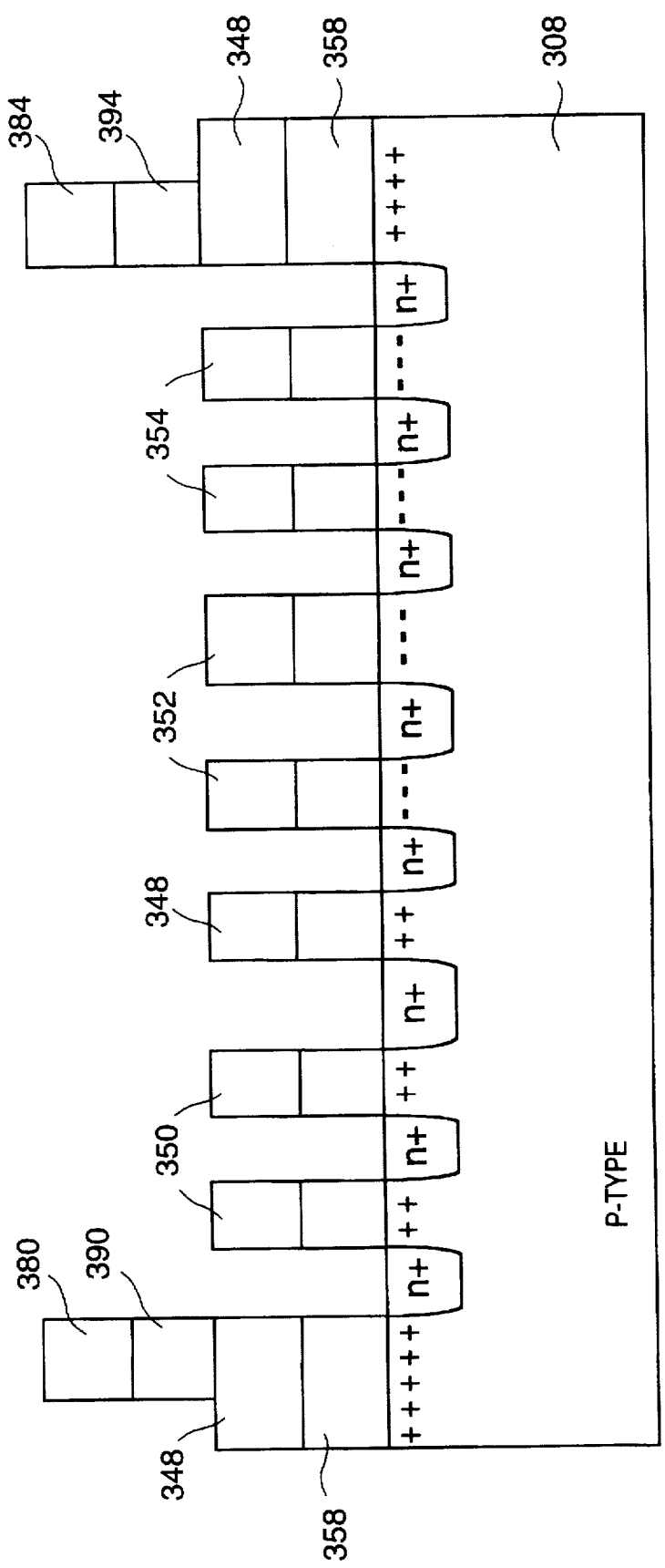

FIG. 26 shows a plan view that illustrates the operation of active pixel sensor cell 300 in accordance with the present invention. FIGS. 27A-27B show cross-sectional views taken along lines 26A—26A and 26B—26B of FIG. 26.

The operation of active pixel sensor cell 300, as with cell 10 of FIG. 1, cell 100 of FIG. 8, and cell 200 of FIG. 17, is performed in three steps: a reset step; an image integration step; and a signal readout step.

In accordance with the present invention, during each of the steps, the poly-1 layer 348, which is conventionally doped, is continuously biased with a negative isolation voltage, e.g., –3 volts. Thus, as with cells 100 and 200, positively-charged holes from first active region 310 are attracted to the surface of substrate 308 which, in turn, electrically isolate adjacent active regions from each other.

As a result, the second alternative embodiment of the present invention also eliminates the need for the field oxide regions that are conventionally used to isolate the n+ active regions of cell 10. By eliminating the field oxide regions, the second embodiment of the present invention also eliminates the active area edge at the bird's beak region, thereby substantially reducing the leakage current of cell 300.

Turning now to the steps, during the reset step, active region 314, which functions as the drain for reset transistor 14 (see FIG. 1), is connected to a positive Vcc voltage, e.g. 3 volts, while reset line 380, which functions as the gate of reset transistor 14, is briefly pulsed (microseconds) with a positive reset voltage, e.g. 3 volts. The reset voltage forms a channel in reset channel region 330 which resets photodiode 322 to an initial integration voltage which is equal to $V_R - V_{T14}$ (e.g., approximately 3 volts), where $V_R$ represents the reset voltage, and $V_{T14}$ represents the threshold voltage of reset transistor 14.

Next, during integration, light energy, in the form of photons, strikes photodiode 322, thereby creating a number of electron-hole pairs. Photodiode 322 is also designed to limit recombination between the newly formed electron-hole pairs. As a result, the photogenerated holes are attracted to substrate 308, which is grounded, while the photogenerated electrons are attracted to sense line 382 where each additional electron reduces the voltage on photodiode 322.

In accordance with the second alternative embodiment of the present invention, during integration, the Vcc voltage is reduced, e.g., 1 volt, while a negative voltage, e.g., –3 volts, is applied to reset line 380. In addition, a positive voltage, e.g., 3 volts, is applied to select line 384.

As a result, as with cells 100 and 200, the reset channel region 330 is biased into accumulation where positively-charged holes from substrate 308 are attracted to the surface of substrate 308. Thus, the large number of holes that are present at the substrate surface of reset channel region 330 will substantially reduce the number of thermally-generated electrons that will be able to transition from the valence band to the conduction band via the mid-band states at the substrate 308-to-oxide 360 interface.

At the same time, the sense channel region 332 and the select channel region 334 are biased into inversion where a large number of negatively-charged electrons are attracted to the surface of substrate 308. These electrons fill the mid-band energy states at the substrate 308-to-oxide 362 and substrate 308-to-oxide 364 interfaces, thereby substantially reducing the likelihood that an electron from a thermally-generated electron-hole pair can transition to the conduction band via the mid-band states. In addition, by having a positive voltage on Vcc, the thermally-generated electrons at the surface will be collected by Vcc.

Following the image integration period, active pixel sensor cell 300 is read out by raising the voltage on Vcc, e.g., 3 volts, and grounding active region 314 which is connected to conventional current detectors. With these bias conditions, the reduced voltage on photodiode 322 reduces the voltage on sense gate 352 (the gate of sense transistor 16 of FIG. 1) which, in turn, reduces the magnitude of the current flowing through from active area 318 to active area 320 (transistors 16 and 18 of FIG. 1). The reduced current level is then detected by the conventional current detectors.

Thus, in accordance with the second alternative embodiment of the present invention, a single-poly active pixel sensor cell has been described that also eliminates the field oxide regions, and insures that all non-doped surface regions are biased into accumulation or inversion. Thus, the second alternative embodiment provides all of the advantages of cell 100 with only a single layer of poly. Cell 300, however, is significantly larger than cell 100 (approximately six times larger), while cell 200 falls in between (approximately three times larger than cell 100).

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. An active pixel sensor cell formed on a silicon substrate, the cell comprising:

a first layer of dielectric material formed over an isolation region of the substrate, the isolation region having an outer wall portion that encloses a plurality of active regions within the substrate, and a protruding wall portion that extends inward from the outer wall portion to define a first active region on one side of the protruding wall portion, and second, third, and fourth active regions on an opposite side of the protruding wall portion, the second and third active regions being separated by a select channel region, the third and fourth active regions being separated by a sense channel region, and the first and fourth active regions being separated by a reset channel region defined by an end of the protruding wall portion and the outer wall portion;

a first layer of conductive material formed over the first layer of dielectric material formed over the isolation region of the substrate;

a second layer of dielectric material formed over a first region of the first layer of conductive material formed over the outer wall portion, the reset channel region, and a first region of the first layer of conductive material formed over the protruding wall portion;

a third layer of dielectric material formed over an area of the first active region, a second region of the first layer of conductive material formed over the protruding wall portion, the sense channel region, and a second region of the first layer of conductive material formed over the outer wall portion;

a fourth layer of dielectric material formed over a third region of the first layer of conductive material formed over the outer wall portion, a third region of the first layer of conductive material formed over the protruding wall portion, the select channel region, and a fourth region of the first layer of conductive material formed over the outer wall portion; and a second layer of conductive material formed over the second, third, and fourth layers of dielectric material.

2. The cell of claim 1 wherein the first and second layers of conductive material include doped polysilicon.

3. The cell of claim 1 wherein the first, second, third, and fourth layers of dielectric material include an oxide.

4. The cell of claim 1 wherein the first, second, third, and fourth active regions are heavily doped.

5. A method for converting light energy into a pixel signal with an active pixel sensor cell formed in a semiconductor substrate of a first conductivity type, wherein the active pixel sensor cell includes:

a first layer of dielectric material formed over an isolation region of the substrate, the isolation region having an outer wall portion that encloses a plurality of active regions within the substrate, and a protruding wall portion that extends inward from the outer wall portion to define a first active region on one side of the protruding wall portion, and second, third, and fourth active regions on an opposite side of the protruding wall portion, the second and third active regions being separated by a select channel region, the third and fourth active regions being separated by a sense channel region, and the first and fourth active regions being separated by a reset channel region defined by an end of the protruding wall portion and the outer wall portion;

a first layer of conductive material formed over the first layer of dielectric material formed over the isolation region of the substrate;

a second layer of dielectric material formed over a first region of the first layer of conductive material formed over the outer wall portion, the reset transistor region, and a first region of the first layer of conductive material formed over the protruding wall portion;

a third layer of dielectric material formed over an area of the first active region, a second region of the first layer of conductive material formed over the protruding wall portion, the sense channel region, and a second region of the first layer of conductive material formed over the outer wall portion;

a fourth layer of dielectric material formed over a third region of the first layer of conductive material formed over the outer wall portion, a third region of the first layer of conductive material formed over the protruding wall portion, the select channel region, and a fourth region of the first layer of conductive material formed over the outer wall portion; and a second layer of conductive material formed over the second, third, and fourth layers of dielectric material, the method comprising the steps of:

applying a first negative voltage to the first layer of conductive material;

applying a second negative voltage to the second layer of conductive material formed over the second layer of dielectric material;

applying a first positive voltage to the fourth active region; and applying a second positive voltage to the second layer of conductive material formed over the fourth layer of dielectric material.

6. The method of claim 5 wherein the first positive voltage is less than the second positive voltage.

7. An active pixel sensor cell formed on a silicon substrate, the cell comprising:

a plurality of active regions formed in the substrate, the plurality of active regions including first, second, third, fourth, and fifth active regions;

a select channel region formed in the substrate between the second and third active regions;

a sense channel region formed in the substrate between the third and fourth active regions;

a reset channel region formed in the substrate between the fourth and fifth active regions;

an exposed substrate region surrounding a substrate area that includes the second, third, fourth, and fifth active regions, and the select, sense, and reset channel regions;

a first isolation substrate region that surrounds the first active region;

a second isolation substrate region that surrounds the first isolation region and the exposed substrate region;

a first conductive line and an underlying insulation layer formed over the first isolation substrate region;

a second conductive line and an underlying insulation layer formed over the reset channel region and first portions of the exposed substrate region;

a third conductive line and an underlying insulation layer formed over the sense channel region and second portions of the exposed substrate region; and a fourth conductive line and an underlying insulation layer formed over the select channel region and third portions of the exposed substrate region.

8. The cell of claim 7 wherein the first, second, third, and fourth conductive lines are formed from doped polysilicon.

9. The cell of claim 7 wherein the first, second, third, fourth, and fifth active regions are heavily doped.

10. An active pixel sensor cell formed on a silicon substrate, the cell comprising:
  a plurality of active regions formed in the substrate, the plurality of active regions including first, second, third, fourth, fifth, and sixth active regions;
  a substrate isolation region that surrounds and isolates the first active region, the second active region, and the fourth active region;
  a reset channel region formed in the substrate between the second and third active regions;
  a sense channel region formed in the substrate between the fourth and fifth active regions;
  a select channel region formed in the substrate between the fourth and sixth active regions;
  an isolation line and an underlying layer of insulation material formed over the substrate isolation region;
  a reset gate and an underlying layer of insulation material formed over the reset channel region;
  a sense gate and an underlying layer of insulation material formed over the sense channel region; and
  a select gate and an underlying layer of insulation material formed over the select channel region.

11. An active pixel sensor cell formed on a semiconductor substrate, the cell comprising:
  a plurality of spaced-apart active regions formed in the substrate, the active regions including a photodiode region and a reset region;
  a separation region defined between the photodiode region and the reset region, the separation region including a first channel region and an isolation region;
  a first conductive structure formed over and insulated from regions of the substrate which adjoin the plurality of active regions to surround the plurality of active regions, and formed over and insulated from the isolation region to partially separate the photodiode region from the reset region; and
  a second conductive structure formed over and insulated from the first channel region and a portion of the first conductive structure.

12. The cell of claim 11 wherein the active regions further include a sense region, the sense region having the first conductive structure formed over and insulated from the substrate on opposite sides of the sense region.

13. The cell of claim 12 and further comprising:
  a second channel region formed between the reset region and the sense region; and
  a third conductive structure formed to contact the photodiode region, and formed over and insulated from the second channel region, the second and third conductive structures being formed from the same layer of material.

14. The cell of claim 12 wherein the conductive structures include doped polysilicon.

15. The cell of claim 12 wherein the first conductive structure is insulated from the substrate by a material from the group including oxide.

16. The cell of claim 12 wherein the active regions are heavily doped.

17. A method for operating an active pixel sensor cell formed in a semiconductor substrate, wherein the cell includes:
  a plurality of spaced-apart active regions formed in the substrate, the active regions including a photodiode region and a reset region,
  a separation region defined between the photodiode region and the reset region, the separation region including a channel region and an isolation region,
  a first conductive structure formed over and insulated from regions of the substrate to surround the plurality of active regions, and formed over and insulated from the isolation region to partially separate the photodiode region from the reset region, and
  a second conductive structure formed over and insulated from the channel region and a portion of the first conductive structure,
  the method including the steps of:
  continuously applying a first voltage to the first conductive structure;
  applying a second voltage to the reset region; and
  pulsing the second conductive structure with a third voltage when the second voltage is applied to the reset region.

18. The method of claim 17 and further comprising the steps of:
  applying a fourth voltage to the reset region after the second conductive structure has been pulsed, the fourth voltage being less than the second voltage; and
  applying a fifth voltage to the second conductive structure after the second conductive structure has been pulsed, the third and fifth voltages having opposite signs.

19. The method of claim 18 wherein the first voltage is negative, and the second and third voltages are positive.

20. A method for operating an active pixel sensor cell formed in a semiconductor substrate, the cell including:
  a plurality of spaced-apart active regions formed in the substrate,
  a plurality of channel regions defined in the substrate between the active regions, and
  a plurality of conductive structures formed over and insulated from the channel regions,
  the method comprising the steps of:
  resetting a first active region;
  collecting photons in the first active region during an integration period after the first active region has been reset; and
  biasing the conductive structures during the integration period so that a first channel region is accumulated, and a second channel region is inverted.

21. The method of claim 20 wherein the resetting step includes the steps of:
  applying a first voltage to a second active region; and
  pulsing a first conductive structure with a second voltage when the first voltage is applied to the second active region.

22. The method of claim 21 wherein the biasing step includes the steps of:
  applying a third voltage to the second active region for the integration period after the first conductive structure has been pulsed, the third voltage being less than the first voltage;
  applying a fourth voltage to the first conductive structure for the integration period after the first conductive structure has been pulsed, the second and fourth voltages having opposite signs; and
  applying a fifth voltage to a second conductive structure for the integration period after the first conductive structure has been pulsed, the fourth and fifth voltages having opposite signs.

23. An active pixel sensor cell formed on a semiconductor substrate of a first conductivity type, the cell comprising:
- a plurality of spaced-apart active regions of a second conductivity type formed in the substrate, the active regions including a photodiode region and a group of remaining active regions;
- a first conductive structure formed over and insulated from regions of the substrate which adjoin the photodiode region to surround the photodiode region; and
- a heavily-doped region of the first conductivity type formed in the substrate to surround said regions of the substrate which adjoin the photodiode region.

24. The active pixel sensor cell of claim 23 and further including an isolation region defined in the substrate to surround the group of remaining active regions, the heavily-doped region surrounding the isolation region.

25. The cell of claim 24 and further comprising:
- a plurality of channel regions formed between the group of remaining active regions; and
- a plurality of second conductive structures formed over the plurality of channel regions.

26. The cell of claim 25 and further comprising a first metal line formed to contact the photodiode region, a first active region of the group of remaining active regions, and a second conductive structure.

27. An active pixel sensor cell formed on a semiconductor substrate of a first conductivity type, the cell comprising:
- a plurality of spaced-apart first active regions of a second conductivity type formed in the substrate;
- a plurality of spaced-apart second active regions of the second conductivity type formed in the substrate, the plurality of second active regions surrounding the plurality of first active regions;
- a third active region;
- a plurality of first conductive structures formed over and insulated from the substrate to surround the first active regions; and
- a second conductive structure formed over and insulated from the substrate to surround the second and third active regions.

28. The cell of claim 27 and further comprising a first metal line formed to contact a second active region, a third active region, and a first conductive structure.

29. An active pixel sensor cell formed on a semiconductor substrate of a first conductivity type, the cell comprising:
- a plurality of spaced-apart first active regions of a second conductivity type formed in the substrate;
- a plurality of spaced-apart second active regions of the second conductivity type formed in the substrate, the second active regions surrounding the first active regions;
- a third active region of the second conductivity type formed in the substrate, a portion of the third active region adjoining a second active region;
- a plurality of first conductive structures formed over and insulated from the substrate to surround the first active regions; and
- a second conductive structure formed over and insulated from the substrate to surround the second and third active regions, the second conductive structure being formed over and insulated from the portion of the third active region that adjoins the second active region.

30. The cell of claim 29 and further comprising a first metal line formed to contact a second active region and a first conductive structure.

* * * * *